(12) United States Patent
Chen et al.

(10) Patent No.: US 9,378,961 B2
(45) Date of Patent: Jun. 28, 2016

(54) METHODS OF FABRICATING MULTIPLE GATE STACK COMPOSITIONS

(71) Applicant: Taiwan Semiconductor Manufacturing Company, Ltd., Hsin-Chu (TW)

(72) Inventors: Po-Nien Chen, Miaoli County (TW); Bao-Ru Young, Hsinchu County (TW); Chi-Hsun Hsieh, Taichung (TW); Harry Hak-Lay Chuang, Singapore (SG); Wei Cheng Wu, Hsinchu County (TW); Eric Huang, Miaoli County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/726,350

(22) Filed: May 29, 2015

(65) Prior Publication Data

US 2015/0262825 A1    Sep. 17, 2015

Related U.S. Application Data

(62) Division of application No. 13/782,720, filed on Mar. 1, 2013, now Pat. No. 9,048,335.

(51) Int. Cl.
*H01L 21/8234* (2006.01)
*H01L 21/28* (2006.01)
*H01L 27/088* (2006.01)
*H01L 29/40* (2006.01)

(52) U.S. Cl.
CPC .... *H01L 21/28158* (2013.01); *H01L 21/28026* (2013.01); *H01L 21/823462* (2013.01); *H01L 27/088* (2013.01); *H01L 29/401* (2013.01)

(58) Field of Classification Search
CPC ............... H01L 21/823857; H01L 21/823462; H01L 29/513; H01L 29/518; H01L 27/0922
USPC .......................................... 438/588, 592, 595
See application file for complete search history.

(56) References Cited

U.S. PATENT DOCUMENTS

| | | | |
|---|---|---|---|
| 5,960,289 A | 9/1999 | Tsui et al. | |
| 6,110,842 A | 8/2000 | Okuno et al. | |
| 6,258,673 B1 | 7/2001 | Houlihan et al. | |
| 6,602,751 B2 | 8/2003 | Oohashi | |
| 6,670,248 B1 | 12/2003 | Ang | |
| 6,787,421 B2 * | 9/2004 | Gilmer ............ | H01L 21/823462 257/E21.01 |
| 6,953,727 B2 | 10/2005 | Hori | |
| 7,118,974 B2 | 10/2006 | Chen et al. | |
| 7,274,046 B2 | 9/2007 | Adam et al. | |
| 7,611,979 B2 | 11/2009 | Callegari et al. | |

(Continued)

*Primary Examiner* — Marcos D Pizarro
(74) *Attorney, Agent, or Firm* — Haynes and Boone, LLP

(57) ABSTRACT

A method including providing a substrate having a first region, a second region, and a third region defined thereupon. A first interfacial layer is formed over the first region, the second region, and the third region. The first interfacial layer is etched to remove a portion of the first interfacial layer from the first region and a portion of the first interfacial layer from the second region. Etching of the first interfacial layer defines a gate stack within the third region. After the etching of the first interfacial layer, a second interfacial layer is formed over at least a portion of the second region. The second interfacial layer is etched to define a gate stack within the second region. After the etching of the second interfacial layer, a third interfacial layer is formed on the substrate over at least a portion of the first region to define a gate stack within the first region.

20 Claims, 19 Drawing Sheets

(56) References Cited

U.S. PATENT DOCUMENTS

| | | |
|---|---|---|
| 7,834,387 B2 | 11/2010 | Booth et al. |
| 7,892,960 B2 | 2/2011 | Park |
| 7,902,610 B2 | 3/2011 | Tai et al. |
| 8,008,143 B2 | 8/2011 | Hsu et al. |
| 2002/0004270 A1 | 1/2002 | Moriwaki et al. |
| 2004/0140518 A1 | 7/2004 | Lee |
| 2005/0014352 A1 | 1/2005 | Torii et al. |
| 2005/0272191 A1 | 12/2005 | Shah et al. |
| 2009/0179255 A1* | 7/2009 | Park ............... H01L 21/823462 257/324 |
| 2009/0256211 A1* | 10/2009 | Booth, Jr. ........ H01L 21/823842 257/407 |
| 2010/0148274 A1 | 6/2010 | Tai et al. |

* cited by examiner

METHODS OF FABRICATING MULTIPLE GATE STACK COMPOSITIONS

PRIORITY DATA

The present application is a divisional application of U.S. patent application Ser. No. 13/782,720, filed Mar. 1, 2013, entitled "Circuit Incorporating Multiple Gate Stack Compositions", hereby incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

As merely one example, in some applications, overall performance of an IC may be improved by tailoring the constituent circuit elements to their particular roles. For example, circuit elements may be tuned by varying the composition of the gate stack. However, as the number of differentiated circuit elements in a single IC grows, the complexity of manufacturing the IC may also increase as a result. With each additional step in the manufacturing process, the yield risk increases. Compounding the difficulty, many advanced materials, including high-k dielectrics and metal gates in the gate stack example, are sensitive and may be damaged by conventional processes for producing layers of varying composition. Therefore, although existing semiconductor fabrication process have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
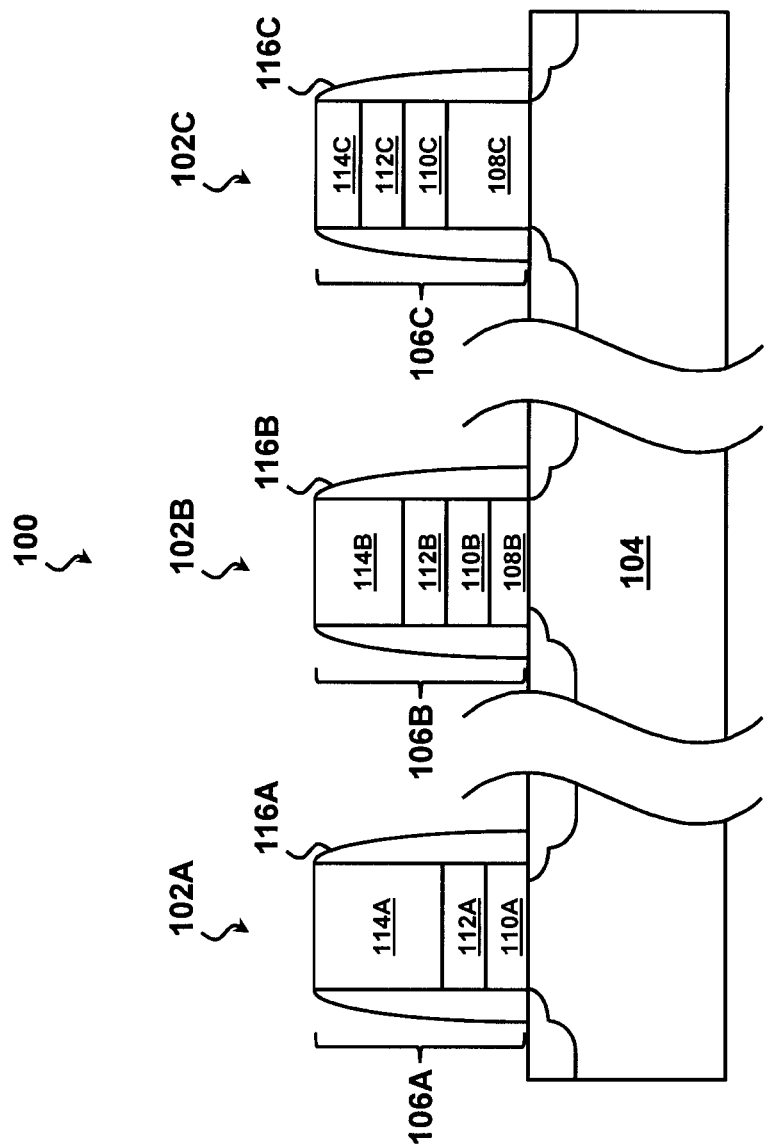
FIG. 1 is a cross-sectional view of an integrated circuit comprising multiple circuit devices according to various aspects of the present disclosure.

The present disclosure relates generally to IC device manufacturing and more particularly, to forming an integrated circuit having device gates of differing compositions.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a cross-sectional view of an integrated circuit 100 comprising multiple circuit devices 102A, 102B, and 102C according to various aspects of the present disclosure. As will be disclosed in more detail below, the circuit devices 102A, 102B, and 102C are structured differently such that each circuit device is tailored to the device's operating environment. It is understood that the principles of the present disclosure apply equally to any and all suitable circuit devices. For example, the principles may be applied to P-channel field effect transistors (PFET), N-channel FET (NFET), metal-oxide semiconductor field effect transistors (MOSFET), complementary metal-oxide semiconductor (CMOS) transistors, FinFETs, high voltage transistors, high frequency transistors, other suitable devices, and/or combinations thereof.

The circuit devices 102A, 102B, and 102C are formed on a semiconductor substrate 104. In some embodiments, the substrate 104 includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The substrate 104 may also comprise non-semiconductor materials including soda-lime glass, fused silica, fused quartz, calcium fluoride ($CaF_2$), and/or other suitable materials. In some embodiments, the substrate 104 has one or more layers defined within it, such as an epitaxial layer. For example, in one such embodiment, the substrate 104 includes an epitaxial layer overlying a bulk semiconductor. Other layered substrates include semiconductor-on-insulator (SOI) substrates. In one such SOI substrate, the substrate 104 includes a buried oxide (BOX) layer formed by a process such as separation by implanted oxygen (SIMOX). In various embodiments, the substrate 104 may take the form of a planar substrate, a fin, a nanowire, and/or other forms known to one of skill in the art.

In some embodiments, the integrated circuit devices 102A, 102B, and 102C each include a gate structure (e.g., gate structures 106A, 106B, and 106C). In an embodiment utilizing a gate first process, the gate structures 106A, 106B, and 106C comprise functional gates. Conversely, in an embodiment utilizing a gate last process, the gate structures 106A, 106B, and 106C comprise dummy gates. An exemplary gate structure (e.g., one of gate structures 106A, 106B, and 106C) may include an interfacial layer (IL) (e.g., interfacial layers 108B and 108C), a gate dielectric layer (e.g., dielectric layers 110A, 110B, and 110C), one or more capping layers (e.g., capping layers 112A, 112B, and 112C), a gate electrode layer (e.g., gate electrode layers 114A, 114B, and 114C), and/or one or more hard mask layers (not shown) above the gate electrode layer. In some embodiments, spacers (e.g., spacers 116A, 116B, and 116C) are formed on one or more lateral surfaces of the gate structure.

In more detail, the interfacial layers 108B and 108C may include an interfacial material such as a silicon oxide, silicon nitride, silicon oxynitride, other semiconductor oxides, other suitable interfacial materials, and/or combinations thereof. The interfacial layers 108B and 108C may be formed to any suitable thickness using any suitable process including thermal growth, atomic layer deposition (ALD), chemical vapor deposition (CVD), high-density plasma CVD (HDP-CVD), physical vapor deposition (PVD), spin-on deposition, and/or other suitable deposition processes.

The gate dielectric layers 110A, 110B, and 110C may comprise dielectric materials, which are commonly characterized by their dielectric constant relative to silicon dioxide. Thus, each of gate dielectric layers 110A, 110B, and 110C may include a high-k dielectric material such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, gate dielectric layers may include other dielectrics such as a silicon oxide, silicon nitride, silicon oxynitride, silicon carbide, amorphous carbon, tetraethylorthosilicate (TEOS), other suitable dielectric material, and/or combinations thereof. The gate dielectric layers 110A, 110B, and 110C may be formed to any suitable thickness using any suitable process including atomic layer deposition (ALD), chemical vapor deposition (CVD), high-density plasma CVD (HDP-CVD), physical vapor deposition (PVD), spin-on deposition, and/or other suitable deposition processes.

The exemplary gate structures may include capping layers 112A, 112B, and 112C. The capping layers may comprise silicon oxide, silicon nitride, silicon oxynitride, other semiconductor oxides, other semiconductor nitrides, other suitable materials, and/or combinations thereof. In an exemplary embodiment, capping layer 112A include silicon nitride formed by a low pressure CVD (LPCVD). In a further embodiment, capping layer 112B includes silicon nitride formed by a plasma enhanced CVD (PECVD). In another embodiment, capping layer 112C includes tetraethyl orthosilicate formed by a CVD process. In yet another embodiment, capping layer 112A includes a silicon oxide formed by a high aspect ratio process (HARP), or another suitable process.

The exemplary gate structures may also include gate electrode layers 114A, 114B, and 114C. Despite naming conventions such as MOSFET, circuit 100 includes embodiments with polysilicon-containing gate electrode layers as well as metal-containing electrode layers. Accordingly, gate electrode layers 114A, 114B, and 114C may include any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments utilizing a gate last process, one of gate electrode layers 114A, 114B, and 114C is a dummy gate electrode and as such includes polysilicon, a masking material, and/or other suitable materials. In such embodiments, the dummy gate electrode layer may later be removed in whole in or part by suitable wet and/or dry etching processes and replaced by another gate electrode layer such as one comprising a metal gate material. Work function metal gate materials included in a metal-containing gate electrode layer may be n-type or p-type work function materials. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer may include a plurality of layers. The gate electrode layers 114A, 114B, and 114C may be deposited by CVD, PVD, and/or other suitable process and may be deposited to any suitable thickness.

In embodiments incorporating a hard mask layer into one or more of gate structures 106A, 106B, and 106C, suitable materials for the hard mask layer include, for example, silicon, dioxide, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material. The hard mask layer may be formed to any suitable thickness using any suitable process including atomic layer deposition (ALD), chemical vapor deposition (CVD), high-density plasma CVD (HDP-CVD), physical vapor deposition (PVD), spin-on deposition, and/or other suitable deposition processes.

As illustrated in FIG. 1, each gate structure may be configured to optimize the corresponding circuit device for its particular operating environment by varying layer thickness, varying layer material, by omitting layers altogether, by adding or duplicating layers, by other suitable techniques, and/or by combinations thereof. As merely one example, device performance depends in part on attributes of the layer or layers between the substrate and the gate electrode. Thus, device performance may be tuned by adjusting characteristics of the dielectric layer. However, some dielectric materials, including many high-k dielectrics, cannot withstand masking and etching processes used to form layers of different thicknesses on a single substrate. Therefore, in some embodiments, device performance is adjusted via the interfacial layers either in addition to or as a substitute for differently configured dielectric layers. For example, devices having gate structures with thinner interfacial layer or lacking an interfacial layer altogether may exhibit lower threshold voltages and decreased switching time, but the resulting device may be more susceptible to gate leakage current, electrostatic discharge, and performance aberrations caused by defects in the corresponding dielectric layer. In some embodiments, faster-switching, high-leakage gates are used for timing critical devices, while reduced-speed, more-efficient gates are used for less critical devices.

Accordingly, in one embodiment, device 102A is configured to have a first threshold voltage, and, correspondingly, has a minimal interface layer or no interfacial layer between the substrate 104 and dielectric 110A. In the embodiment, device 102B is configured to have a higher threshold voltage and reduced gate leakage current compared to device 102A, and thus device 102B includes an interfacial layer 108B of greater thickness than that of device 102A. Finally, device 102C is configured to operate as an IO device. IO devices often operate at greater voltages than other devices in the same circuit and may be designed to withstand significant voltage differences at the gate. Power is often less of a concern for IO devices as well. Therefore, in the embodiment, device 102C includes an interfacial layer 108C of greater thickness than that of device 102A or device 102B. Interfacial layer 108C may also comprise a different interfacial material than layer 108B. In one embodiment, interfacial layer 108B includes silicon oxynitride while interfacial layer 108C includes a silicon oxide. In this way, the performance of each device 102A, 102B, and 102C can be tailored to its respective operating environment.

The principles of adapting multiple circuit devices of a single circuit to their particular operating environments by modifying layer thickness, layer materials and other layer characteristics can be applied beyond the interfacial layers 108B and 108C to other layers of the gate structures, and such embodiments are both contemplated and provided for.

Figure 2:
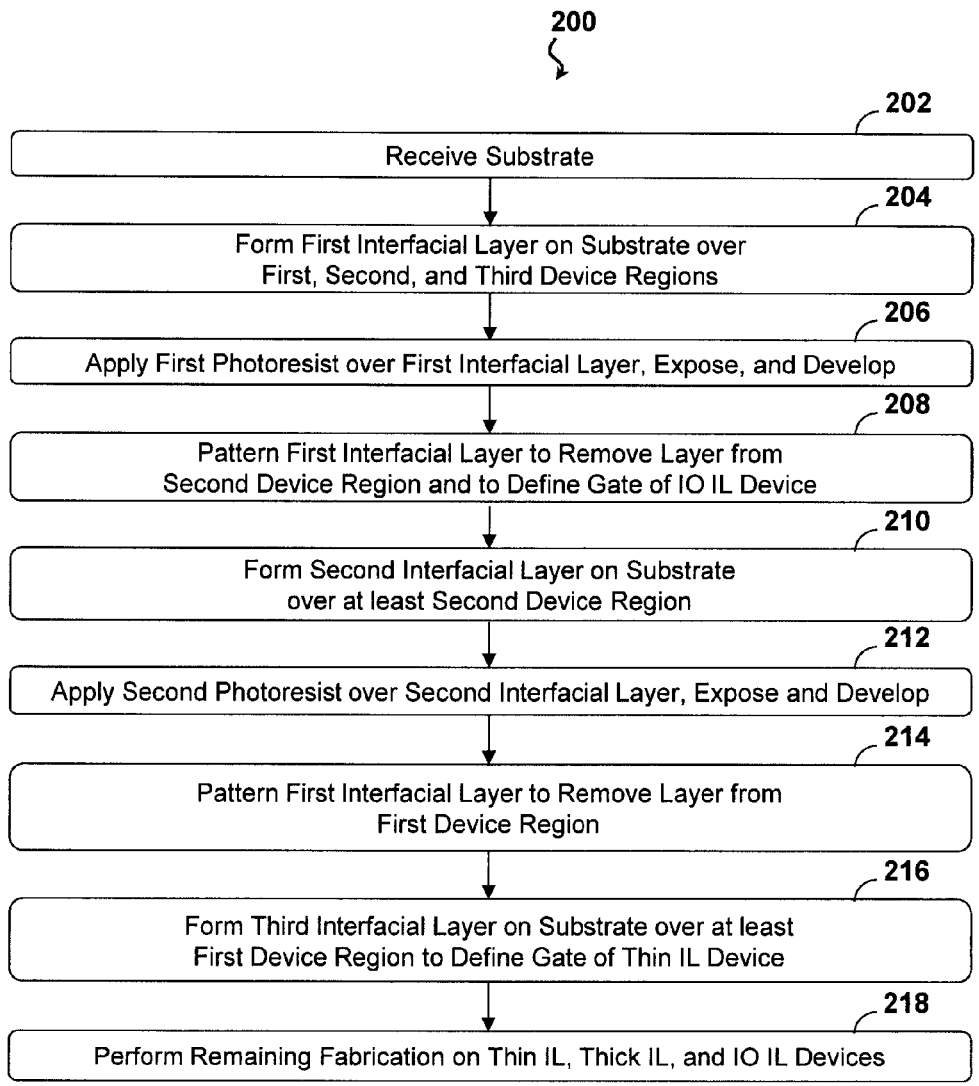
FIG. 2 is a flow diagram of the method for forming for forming multiple circuit device gate structures according to various aspects of the present disclosure.

A method 200 for forming multiple circuit device gate structures adapted for different performance is disclosed with reference to FIGS. 2-12. FIG. 2 is a flow diagram of the method 200 for forming for forming multiple circuit device gate structures according to various aspects of the present disclosure. It is understood that additional steps can be provided before, during, and after the method 200, and some of the steps described can be replaced or eliminated for other embodiments of the method 200. FIGS. 3-12 are diagrammatic cross-sectional views of an integrated circuit 300 comprising multiple circuit devices (e.g., thin IL device 302A, thick IL device 302B, and IO IL device 302C) undergoing the method 200 of forming multiple circuit device gate structures according to various aspects of the present disclosure.

Figure 3:
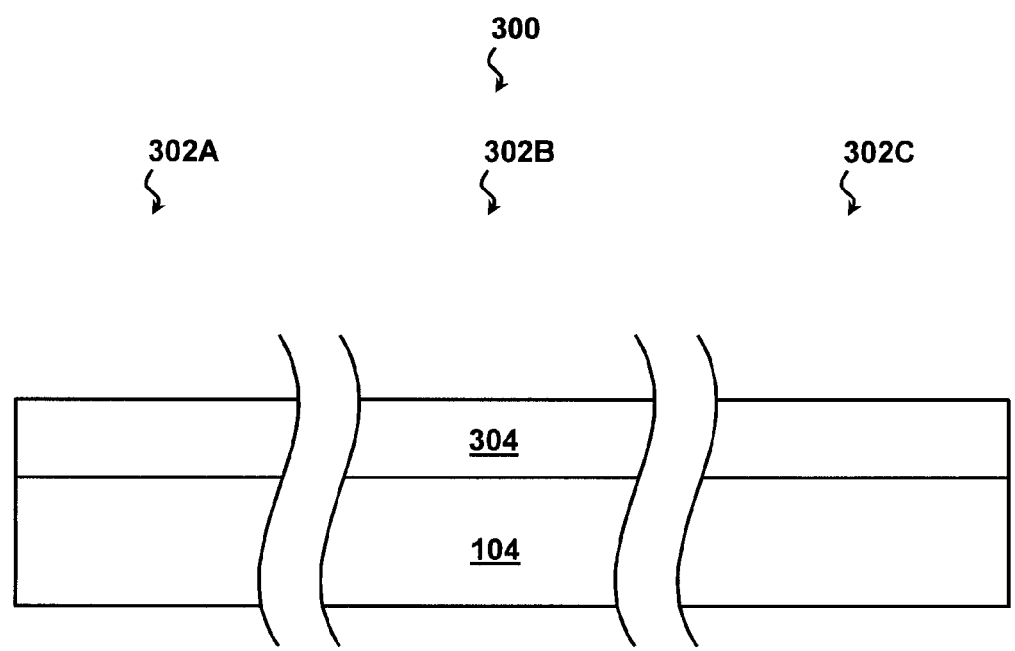
FIGS. 3-12 are diagrammatic cross-sectional views of an integrated circuit comprising multiple circuit devices undergoing a method of forming the dielectric-semiconductor interface according to various aspects of the present disclosure.

Referring to FIG. 3 and block 202, a substrate 104 is received. The substrate 104 may be substantially similar to substrate 104 described with respect to FIG. 1. In that regard, the substrate 104 may include an elementary semiconductor, a compound semiconductor, an alloy semiconductor, a non-semiconductor material, and/or combinations thereof. In various embodiments, the substrate 104 may take the form of a planar substrate, a fin, a nanowire, and/or other forms known to one of skill in the art. In block 204, a first interfacial layer 304 is formed on the substrate 104 such that it extends over at least a portion the regions corresponding to devices 302A, 302B, and 302C. The first interfacial layer 304 may be substantially similar to the interfacial layers 108B and 108C described with respect to FIG. 1. In that regard, the first interfacial layer may include an interfacial material such as a silicon oxide, silicon nitride, silicon oxynitride, other semiconductor oxides, other suitable interfacial materials, and/or combinations thereof. The first interfacial layer 304 may be formed to any suitable thickness using any suitable process including thermal growth, atomic layer deposition (ALD), chemical vapor deposition (CVD), high-density plasma CVD (HDP-CVD), physical vapor deposition (PVD), spin-on deposition, and/or other suitable deposition processes. In an embodiment, the first interfacial layer 304 is characteristic of an IO interfacial layer and includes a silicon oxide formed to a thickness of between about 25 Angstroms and about 40 Angstroms.

Figure 4A:
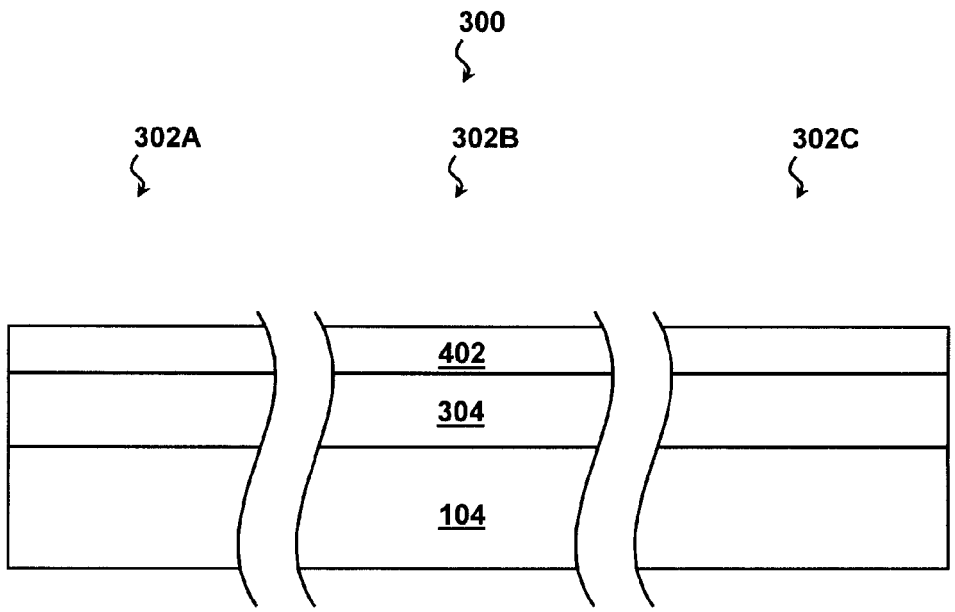
Figure 4B:
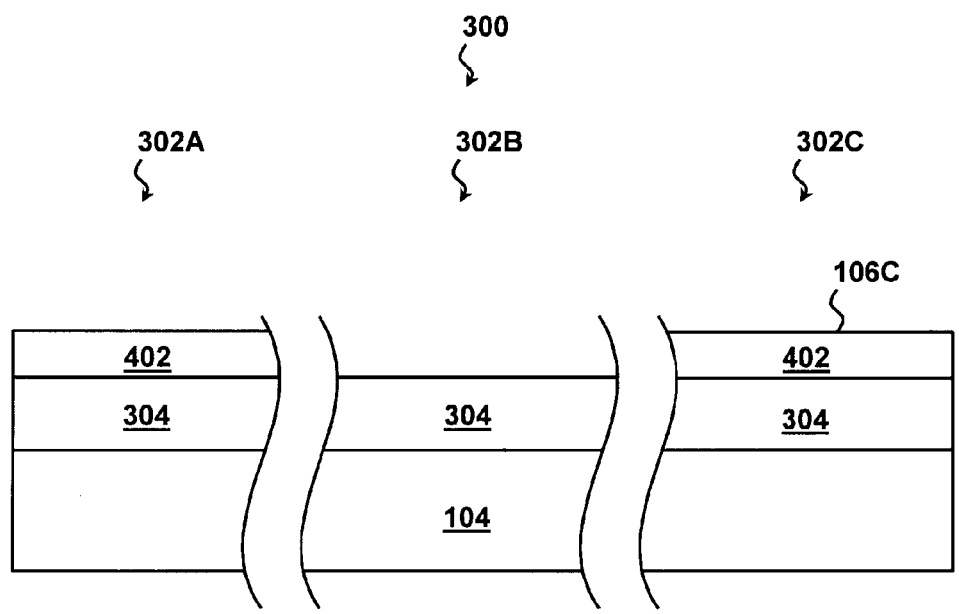

Referring to FIG. 4A and block 206, a first photoresist layer 402 may be applied over the substrate 104 and may be used in defining a gate structure of the IO IL device 302C. The photoresist 402 may be exposed in a photolithographic process, baked, and developed to reveal an area to be patterned as illustrated in FIG. 4B. In the illustrated embodiment, the patterning removes the photoresist 402 from at least a portion of the region corresponding to the thick IL device 302B, but leaves the photoresist 402 present in at least a portion of the region corresponding to the thin IL device 302A and a portion of the region corresponding to the IO IL device 302C.

Figure 5A:
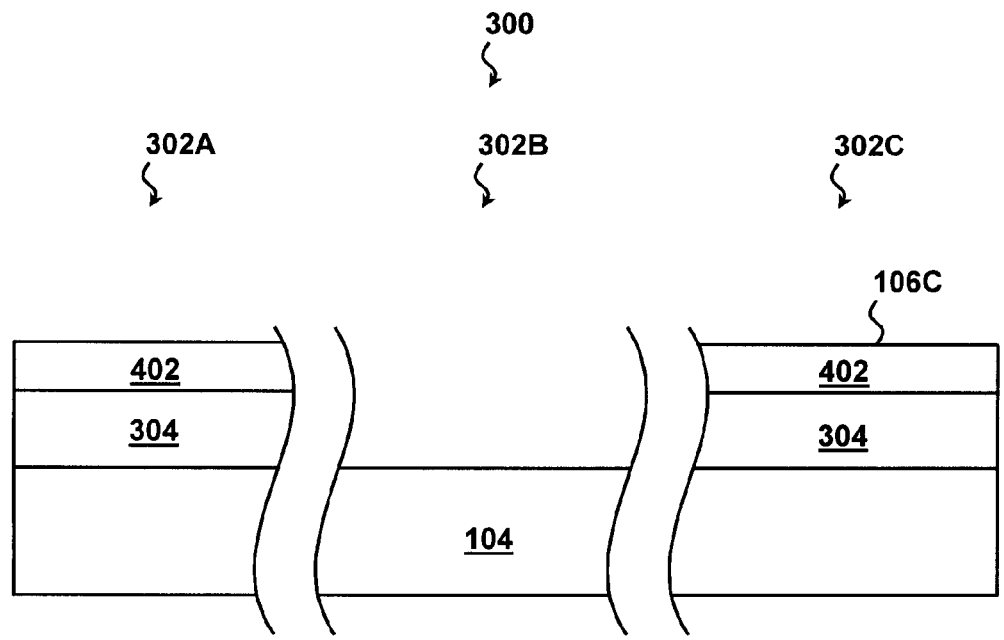
Figure 5B:
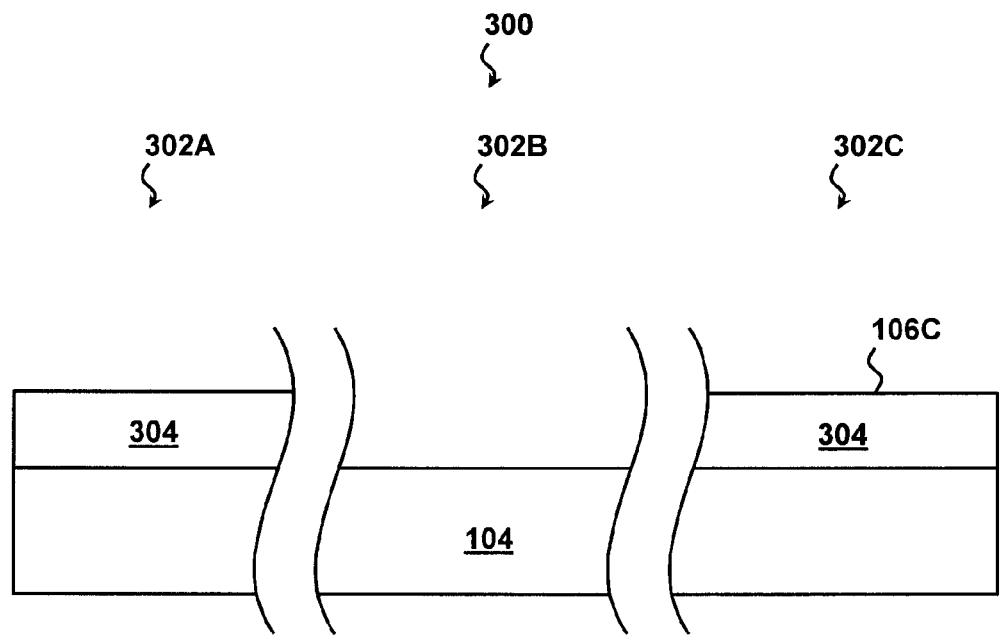

Referring to FIG. 5A and block 208, the first interfacial layer 304 is patterned. In some embodiments, the area of the first interfacial layer 304 unprotected by the first photoresist layer 402 is patterned via etching. In the illustrated embodiment, patterning removes the first interfacial layer 304 from at least a portion of the region corresponding to the thick IL device 302B, but leaves the first interfacial layer 304 present in at least a portion of the region corresponding to the thin IL device 302A and a portion of the region corresponding to the IO IL device 302C. The patterning of the first interfacial layer 304 further defines a gate structure 106C within the region corresponding to the IO IL device 302C. Patterning may be performed using wet etching, dry etching, reactive ion etching, and/or other suitable etching processes, and in one embodiment, the first interfacial layer 304 is etched using a dilute HF solution. In alternate embodiments, the first interfacial layer 304 is patterned using a maskless process such as e-beam or laser etching. Following the patterning of the first interfacial layer 304, any remaining photoresist 402 may be stripped from the substrate 104 as illustrated in FIG. 5B.

Figure 6:
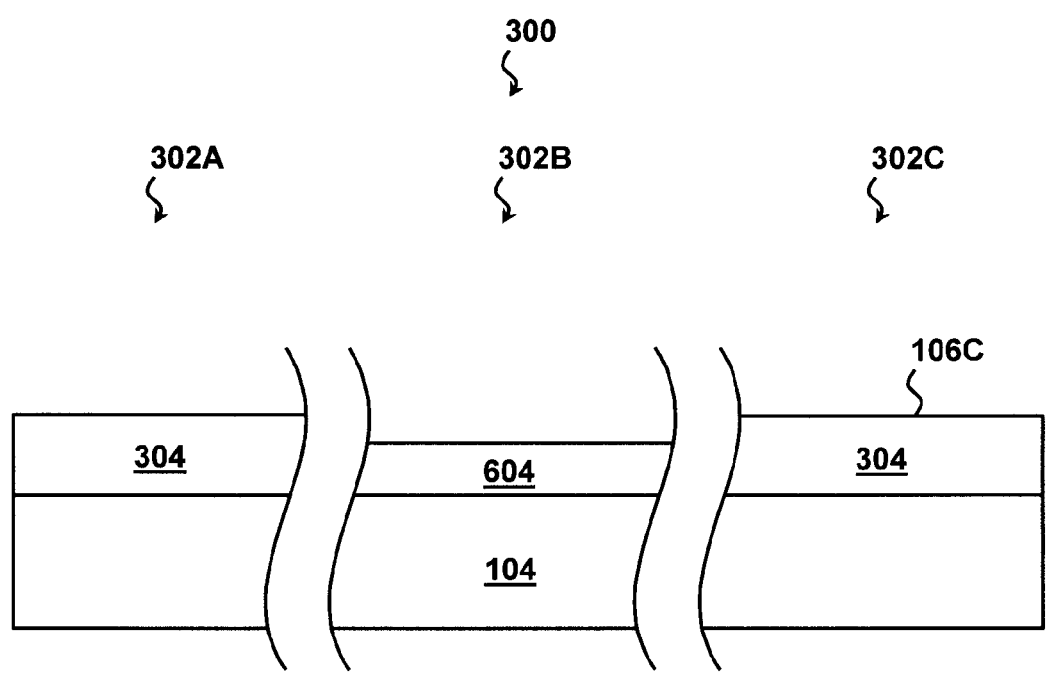

Referring to FIG. 6 and block 210, a second interfacial layer 604 is formed on the substrate 104 such that it extends over at least a portion of the region corresponding to the thick IL device 302B. The first interfacial layer 304 may prevent the second interfacial layer 604 from being formed over portions of the regions corresponding to devices 302A and 302C. For example, the first interfacial layer 304 may prevent the second interfacial layer 604 from being formed over the gate structure 106A of device 302A and the gate structure 106C of device 302C. The second interfacial layer 604 may be substantially similar to the interfacial layers 108B and 108C described with respect to FIG. 1. In that regard, the second interfacial layer 604 may include an interfacial material such as a silicon oxide, silicon nitride, silicon oxynitride, other semiconductor oxides, other suitable interfacial materials, and/or combinations thereof. The second interfacial layer 604 may be formed to any suitable thickness using any suitable process including thermal growth, atomic layer deposition (ALD), chemical vapor deposition (CVD), high-density plasma CVD (HDP-CVD), physical vapor deposition (PVD), spin-on deposition, and/or other suitable deposition processes.

The second interfacial layer 604 may be different in composition from the first interfacial layer 304. In one such embodiment, the second interfacial layer 604 is formed to a different thickness than the first interfacial layer 304. In a further such embodiment, the second interfacial layer 604 is formed to include an interfacial material not included in the first interfacial layer 304. In yet another such embodiment, the second interfacial layer 604 is formed to a different thickness than the first interfacial layer 304 and includes an interfacial material not included in the first interfacial layer 304. In an embodiment, the second interfacial layer 604 includes a semiconductor oxynitride and is formed to a thickness of between about 10 Angstroms and about 20 Angstroms.

Figure 7A:
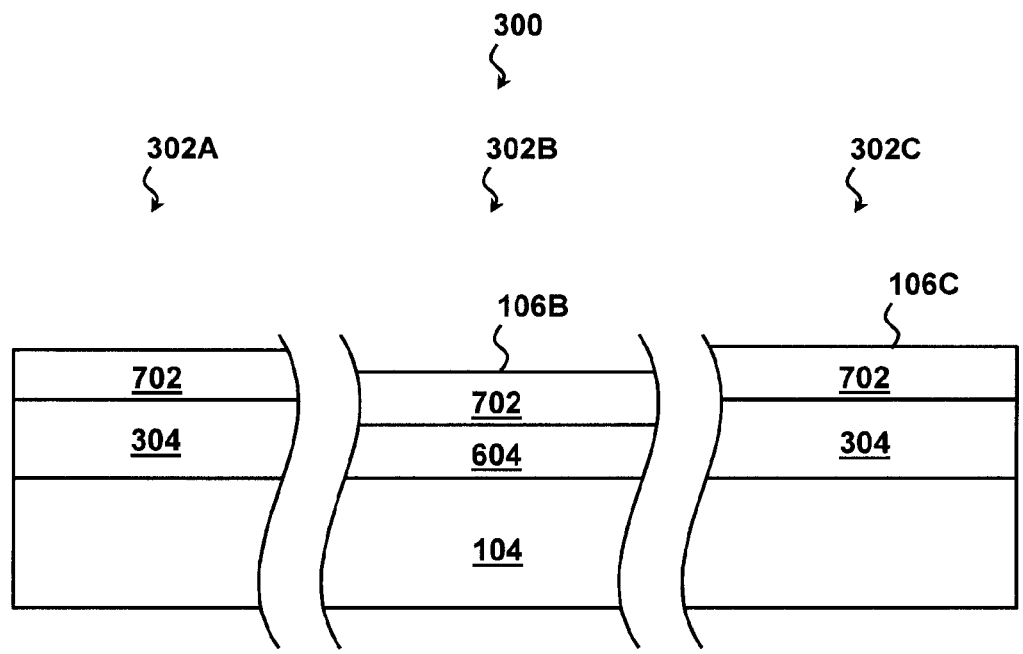
Figure 7B:
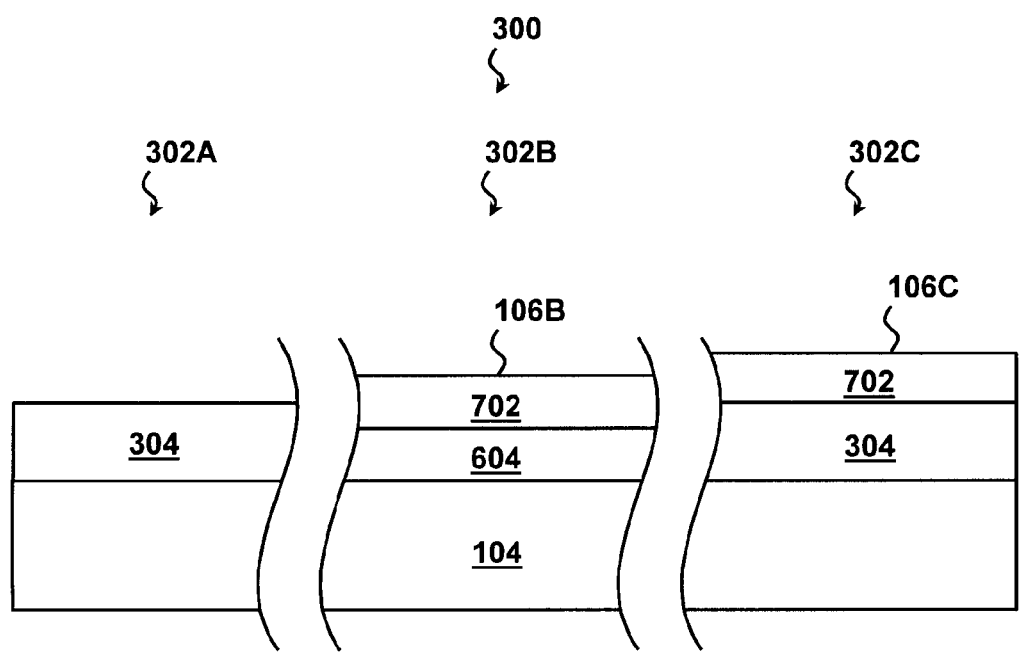

Referring to FIG. 7A and block 212, a second photoresist layer 702 may be applied over the substrate 104 and may be used in defining a gate structure of the thick IL device 302B. The second photoresist 702 may be exposed in a photolithographic process, baked, and developed to reveal an area to be patterned as illustrated in FIG. 7B. In the illustrated embodiment, the patterning removes the photoresist 702 from at least a portion of the region corresponding to the thin IL device 302A, but leaves the photoresist 702 present in at least a portion of the region corresponding to the thick IL device 302B and a portion of the region corresponding to the IO IL device 302C.

Figure 8A:
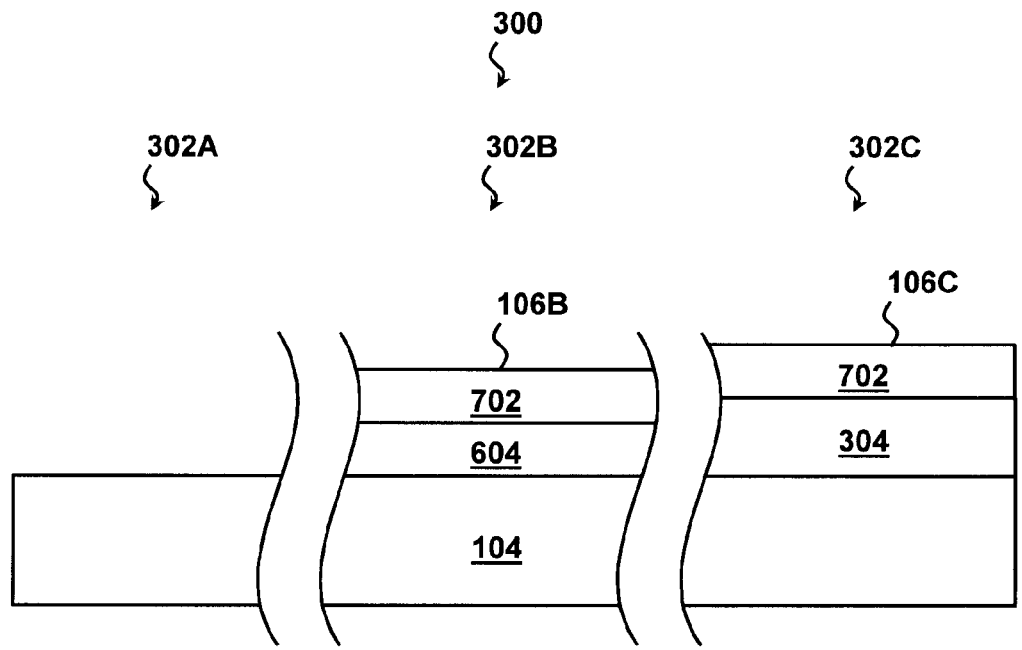
Figure 8B:
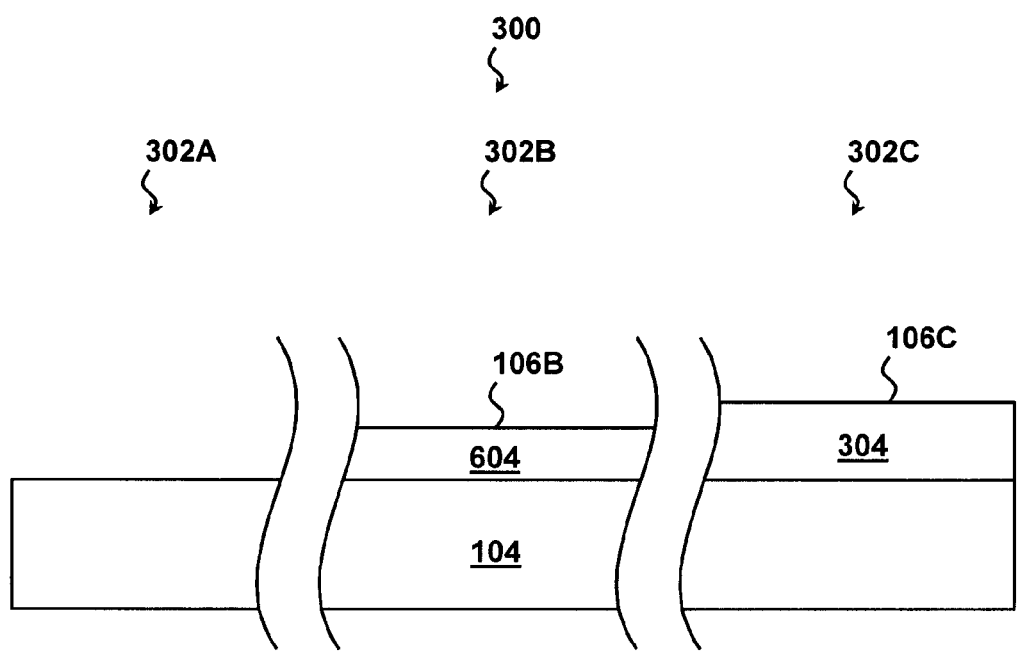

Referring to FIG. 8A and block 214, the first interfacial layer 304 is patterned. In some embodiments, the area of the first interfacial layer 304 unprotected by the second photoresist layer 702 is patterned by etching. In the illustrated embodiment, patterning removes the first interfacial layer 304 from at least a portion of the region corresponding to the thin IL device 302A, but leaves the second interfacial layer 604 present in at least a portion of the region corresponding to the thick IL device 302B and the first interfacial layer 304 in a portion of the region corresponding to the IO IL device 302C. The patterning of the first interfacial layer 304 may also define a gate structure 106B within the region corresponding to the thick IL device 302B. Patterning of the first interfacial layer 304 may be performed using wet etching, dry etching, reactive ion etching, and/or other suitable etching processes, and in one embodiment, the first interfacial layer 304 is etched using a dilute HF solution. In alternate embodiments, the first interfacial layer 304 is patterned using a maskless process such as e-beam or laser etching. Following the patterning of the first interfacial layer 304, any remaining photoresist 702 may be stripped from the substrate 104 as illustrated in FIG. 8B.

Figure 9:
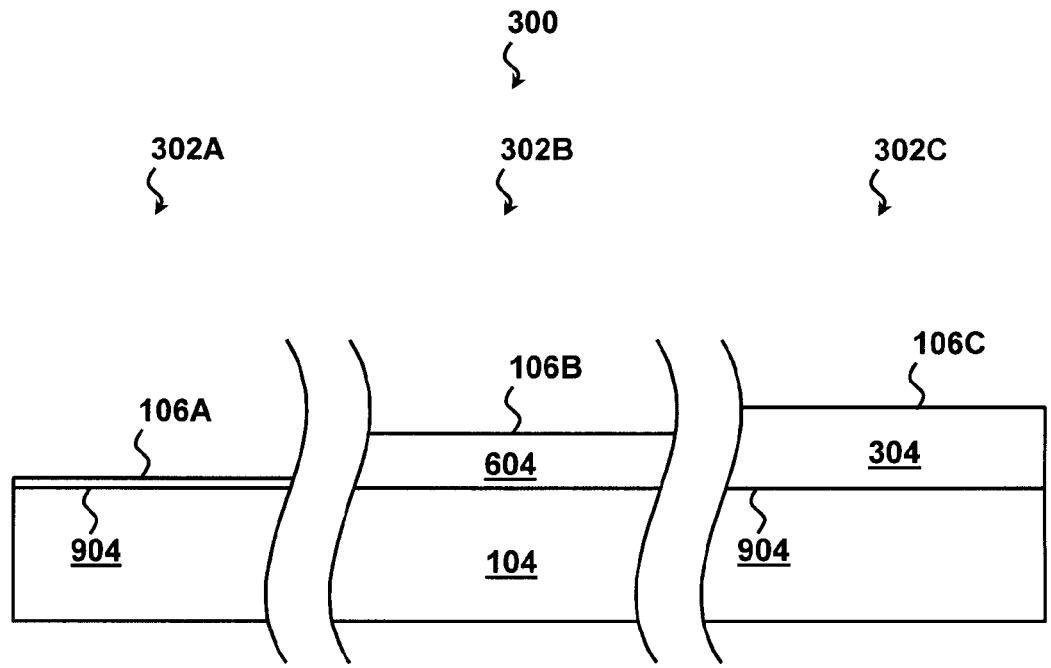

Referring to FIG. 9 and block 216, a third interfacial layer 904 is formed on the substrate 104 such that it extends over at least the region corresponding to the thin IL device 302A. The first interfacial layer 304 and second interfacial layer 604 may prevent the third interfacial layer 904 from being formed over portions of the regions corresponding to devices 302C and 302B, respectively. For example, the first interfacial layer 304 and second interfacial layer 604 may prevent the third interfacial layer 904 from being formed over the gate structures 106C and 106B of devices 302C and 302B, respectively. The third interfacial layer 904 may be substantially similar to the interfacial layers 108B and 108C described with respect to FIG. 1. In that regard, the third interfacial layer 904 may include an interfacial material such as a silicon oxide, silicon nitride, silicon oxynitride, other semiconductor oxides, other suitable interfacial materials, and/or combinations thereof. The third interfacial layer 904 may be formed to any suitable thickness using any suitable process including thermal growth, atomic layer deposition (ALD), chemical vapor deposition (CVD), high-density plasma CVD (HDP-CVD), physical vapor deposition (PVD), spin-on deposition, and/or other suitable deposition processes. The formation of the third interfacial layer 904 defines a gate structure 106A within the region corresponding to the thin IL device 302A.

The third interfacial layer 904 may be different in composition from the first interfacial layer 304 and the second interfacial layer 604. In one such embodiment, the third interfacial layer 904 is formed to a different thickness than the first and second interfacial layers. In a further such embodiment, the third interfacial layer 904 is formed to include an interfacial material not included in one or more of the first interfacial layer 304 and the second interfacial layer 604. In yet another such embodiment, the third interfacial layer 904 is formed to a different thickness than the first interfacial layer 304 and the second interfacial layer 604 and includes an interfacial material not included in one or more of the first interfacial layer 304 and the second interfacial layer 604. In an embodiment, the third interfacial layer 904 includes a semiconductor oxynitride and is formed to a thickness of between about 1 Angstroms and about 5 Angstroms less than the thickness of the second interfacial layer 604. In other words, in the above embodiment, the third interfacial layer 904 is formed to a thickness of between about 5 Angstroms and 20 Angstroms and less than the thickness of the second interfacial layer 604. As thinner interfacial layers tend to be more sensitive, and the third interfacial layer 904 is subject to fewer applications of photoresist and subsequent etchings than the first and second layers, in some embodiments, the thinnest interfacial layer is selected to be the third interfacial layer 904.

Figure 10:
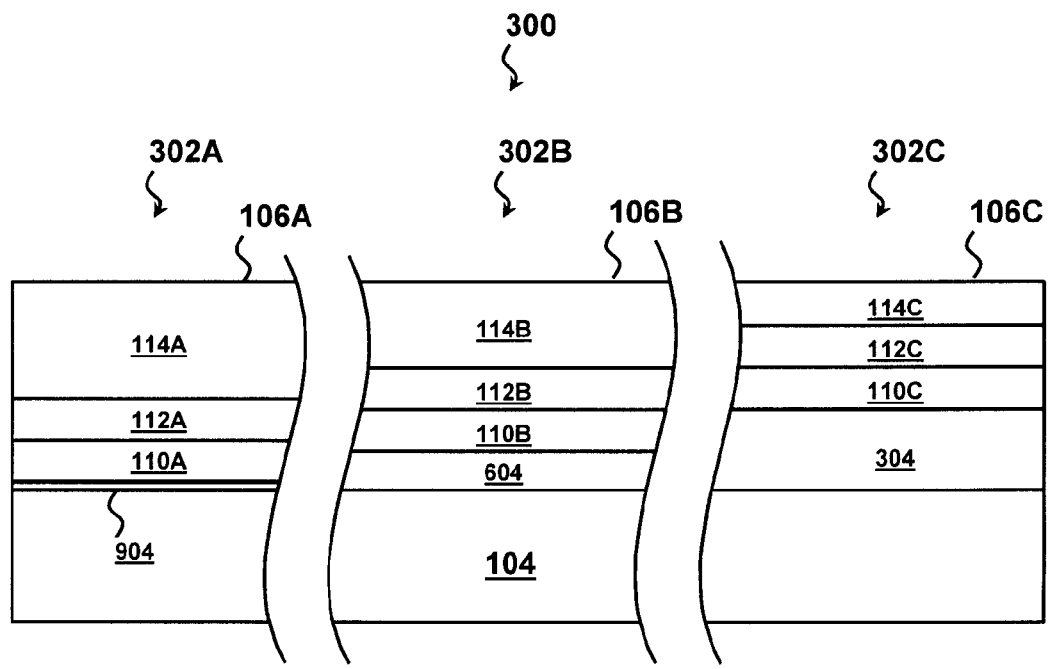
Figure 11:
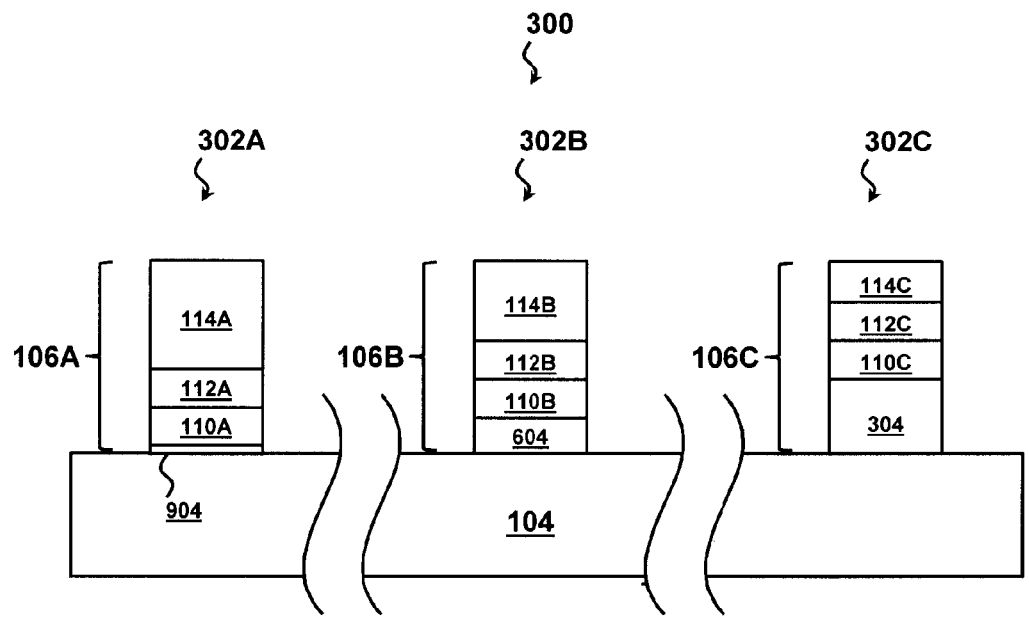
Figure 12:
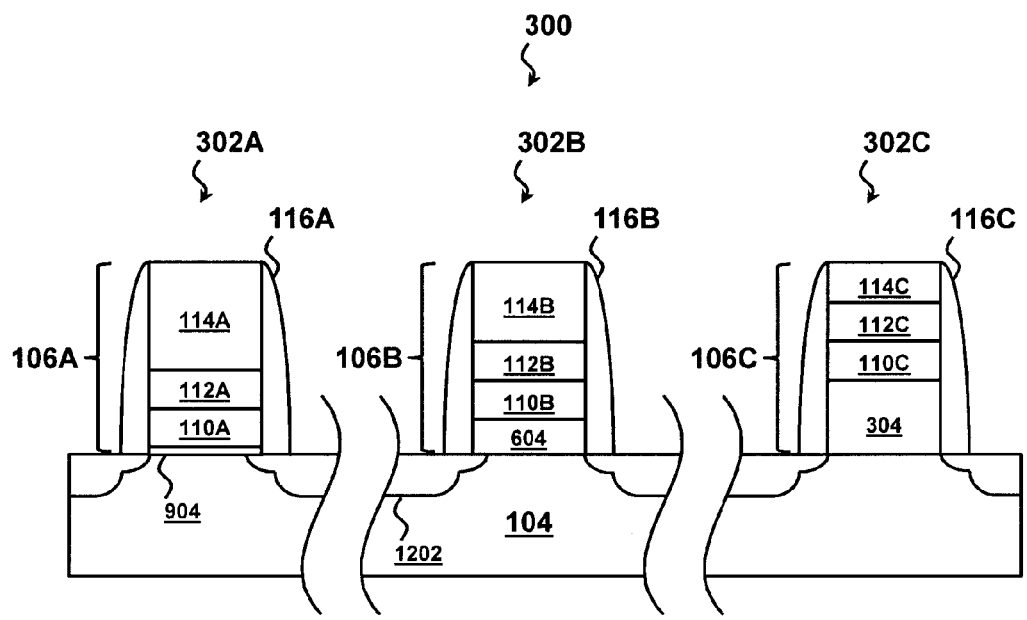

Referring to FIGS. 10-12 and block 218, subsequent processing steps are performed to finish the fabrication of the first, second, and third devices (e.g., thin IL device 302A, thick IL device 302B, and IO IL device 302C). Referring first to FIG. 10, in some embodiments, a gate dielectric is formed over interfacial layers 904, 604, and 304 of the thin IL device 302A, thick IL device 302B, and IO IL device 302C, respectively, to form dielectric layers 110A, 110B, and 110C, which may be substantially similar to those disclosed with respect to FIG. 1. In some such embodiments, dielectric layers 110A, 110B, and 110C have substantially equal thickness and have substantially the same dielectric composition. In one such embodiment, each of dielectric layers 110A, 110B, and 110C includes the same high-k dielectric formed to a substantially equal thickness between about 10 Angstroms and about 15 Angstroms. These subsequent processes of block 218 may also include forming one or more capping layers (e.g., capping layers 112A, 112B, and 112C), a gate electrode layer (e.g., gate electrode layers 114A, 114B, and 114C), and/or one or more hard mask layers (not shown), each substantially similar to those disclosed with respect to FIG. 1.

Referring to FIG. 11, the subsequent processing steps of block 218 may include the shaping of gates 106A, 106B, and 106C using a process including photolithographic patterning and etching. In one embodiment, a layer of photoresist is formed on the regions corresponding to devices 302A, 302B, and 302C by a suitable process, such as spin-on coating. The photoresist is then exposed in a photolithographic process, baked, and developed. The pattern of the photoresist is transferred by a dry etching process to the layers to form gate electrodes and gate dielectric, in a plurality of processing steps and various proper sequences. The photoresist layer may be stripped thereafter.

Referring to FIG. 12, the processing steps of block 218 may also include forming sidewall spacers 116A, 116B, and 116C on one or more lateral surfaces of the gate structure and/or forming source/drain regions 1202. The source/drain regions 1202 may be doped with p-type dopants (P+), such as boron or $BF_2$, and/or n-type dopants (N+), such as phosphorus or arsenic. In some embodiments, the source/drain regions 1202 are formed by processes including halo implantation, etching, ion-implantation, epitaxy, and/or annealing steps. It is understood that some elements of the devices 302A, 302B, and 302C may be formed by conventional processing, and thus some processes are not described in detail herein.

Figure 13:
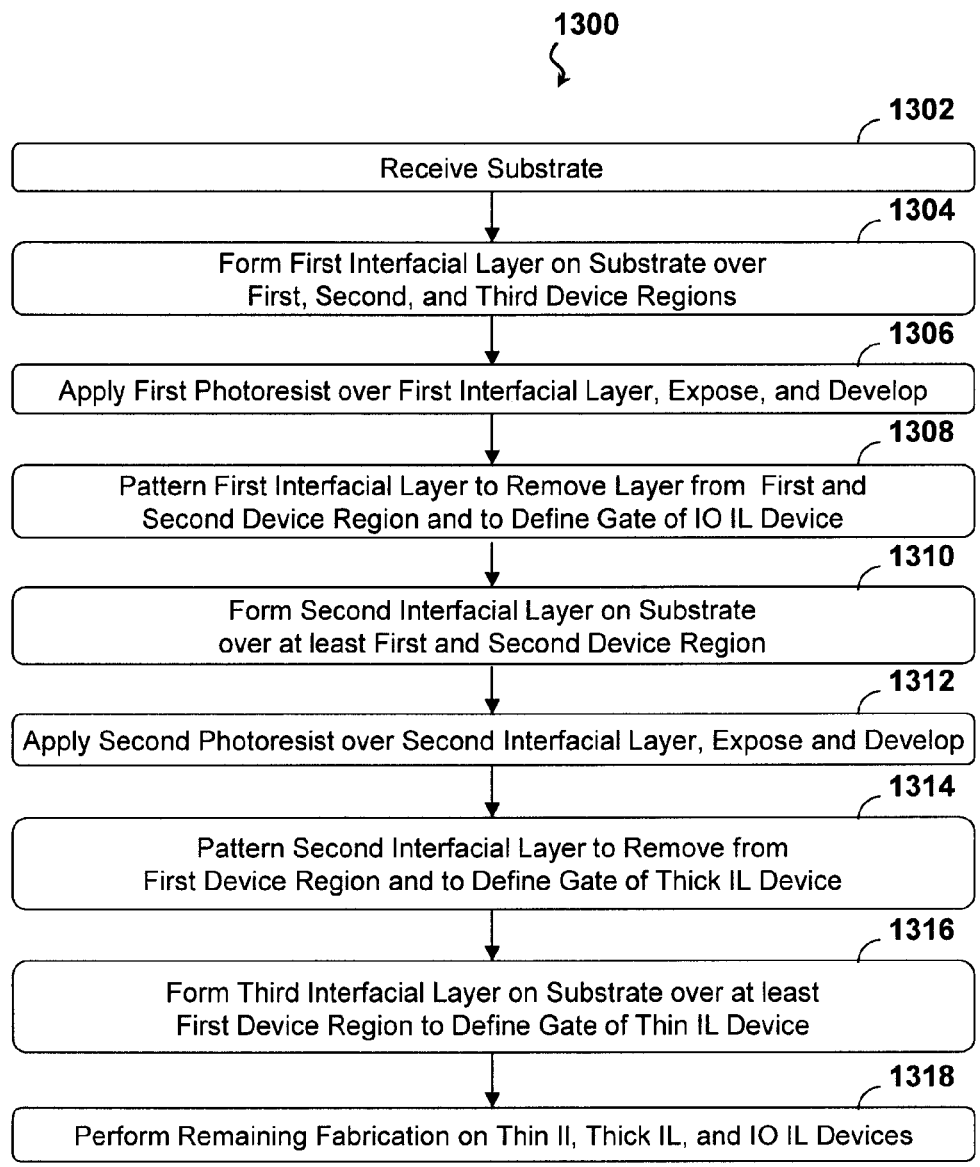
FIG. 13 is a flow diagram of a method for forming for forming multiple circuit device gate structures according to various aspects of the present disclosure.

A further method 1300 for forming multiple circuit device gate structures adapted for different performance is disclosed with reference to FIGS. 13-23. FIG. 13 is a flow diagram of the method 1300 for forming for forming multiple circuit device gate structures according to various aspects of the present disclosure. It is understood that additional steps can be provided before, during, and after the method 1300, and some of the steps described can be replaced or eliminated for other embodiments of the method 1300. FIGS. 14-23 are diagrammatic cross-sectional views of an integrated circuit 1400 comprising multiple circuit devices (e.g., thin IL device 1402A, thick IL device 1402B, and IO IL device 1402C) undergoing the method 1300 of forming multiple circuit device gate structures according to various aspects of the present disclosure.

Figure 14:
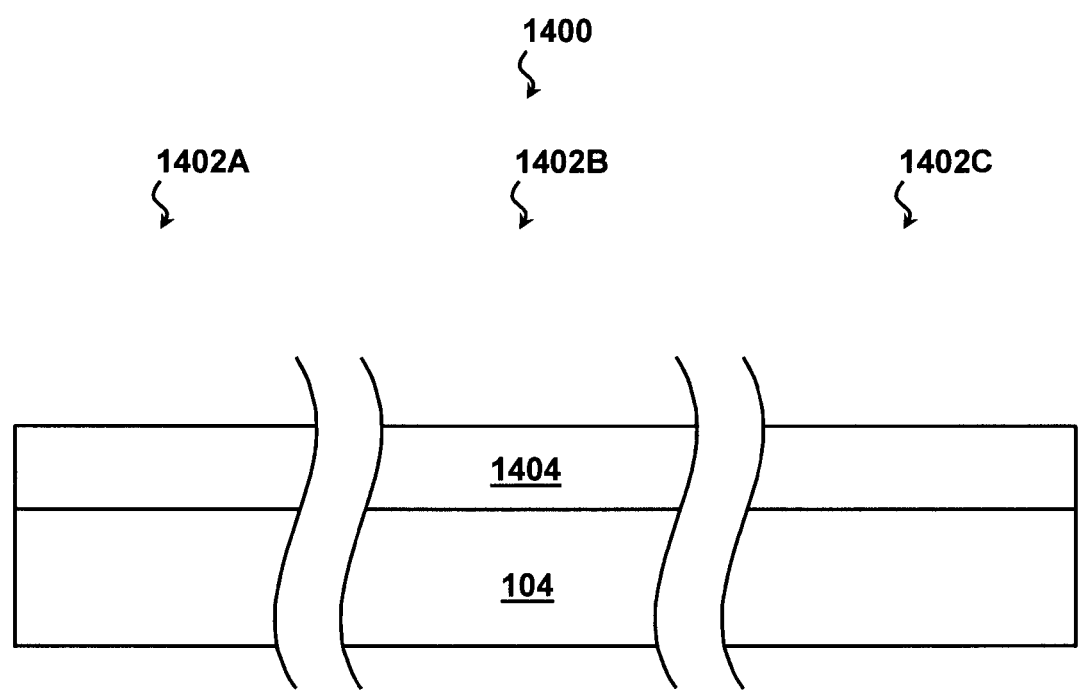
FIGS. 14-23 are diagrammatic cross-sectional views of an integrated circuit comprising multiple circuit devices undergoing a method of forming multiple circuit device gate structures according to various aspects of the present disclosure.

Referring to FIG. 14 and block 1302, a substrate 104 is received. The substrate 104 may be substantially similar to substrate 104 described with respect to FIG. 1. In that regard, the substrate 104 may include an elementary semiconductor, a compound semiconductor, an alloy semiconductor, a non-semiconductor material, and/or combinations thereof. In various embodiments, the substrate 104 may take the form of a planar substrate, a fin, a nanowire, and/or other forms known to one of skill in the art. In block 1304, a first interfacial layer 1404 is formed on the substrate 104 such that it extends over at least a portion of the regions corresponding to devices 1402A, 1402B, and 1402C. The first interfacial layer 1404 may be substantially similar to the interfacial layers 108B and 108C described with respect to FIG. 1. In that regard, the first interfacial layer may include an interfacial material such as a silicon oxide, silicon nitride, silicon oxynitride, other semiconductor oxides, other suitable interfacial materials, and/or combinations thereof. The first interfacial layer 1404 may be formed to any suitable thickness using any suitable process including thermal growth, atomic layer deposition (ALD), chemical vapor deposition (CVD), high-density plasma CVD (HDP-CVD), physical vapor deposition (PVD), spin-on deposition, and/or other suitable deposition processes. In an embodiment, the first interfacial layer 1404 is characteristic of an IO interfacial layer and includes a silicon oxide formed to a thickness of between about 25 Angstroms and about 40 Angstroms.

Figure 15A:
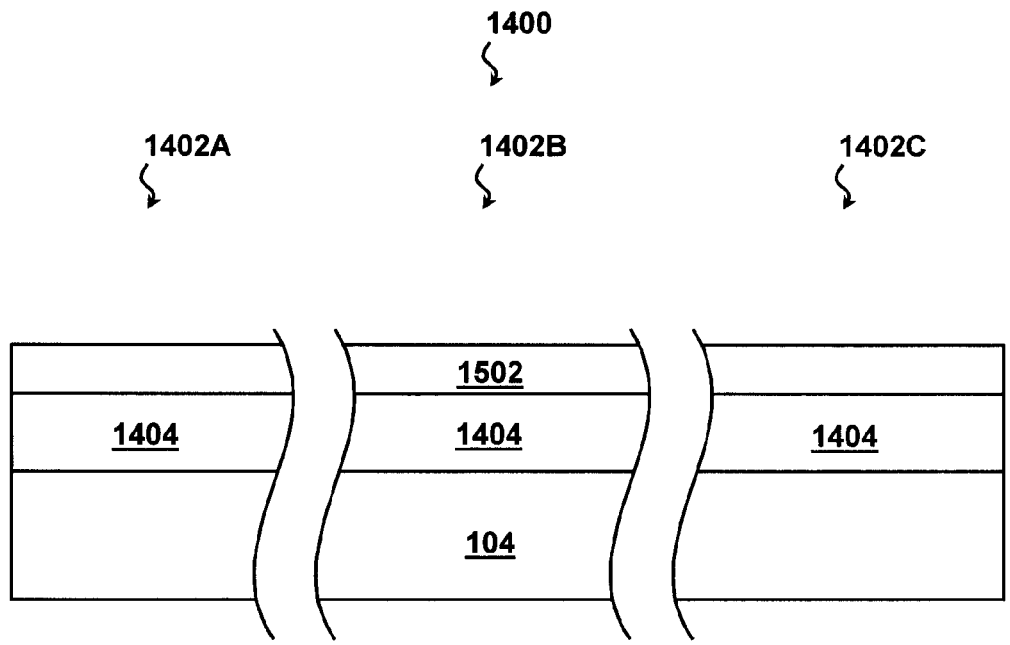
Figure 15B:
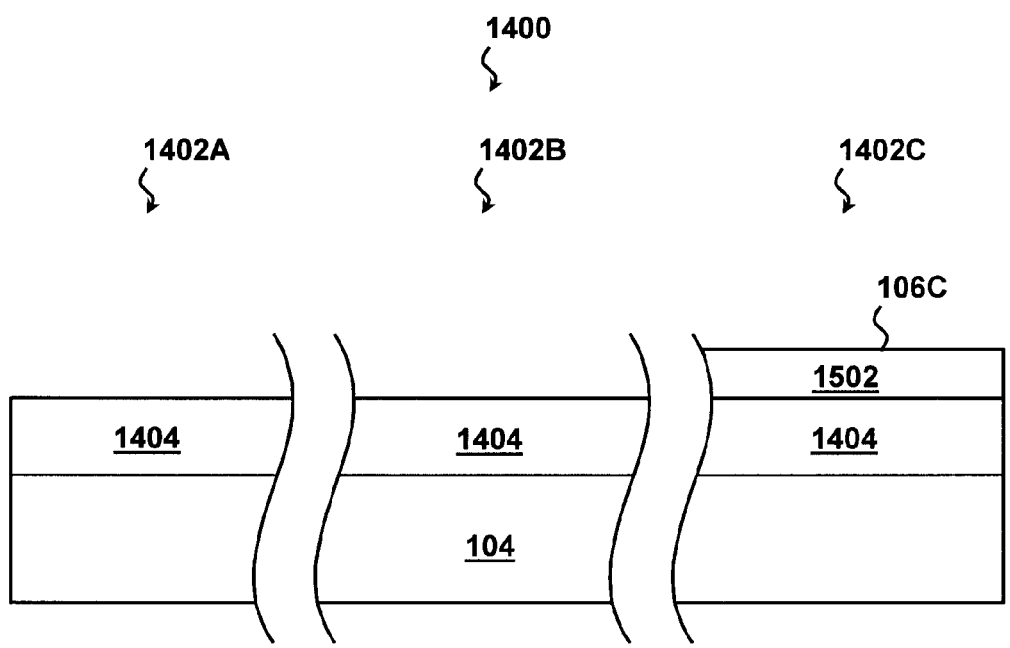

Referring to FIG. 15A and block 1306, a first photoresist layer 1502 may be applied over the substrate 104 and may be used in defining a gate structure of the IO IL device 1402C. The photoresist 1502 may be exposed in a photolithographic process, baked, and developed to reveal an area to be patterned as illustrated in FIG. 15B. In the illustrated embodiment, the patterning removes the photoresist 1502 from at least a portion of the region corresponding to the thin IL device 1402A and at least a portion of the region corresponding to the thick IL device 1402B, but leaves the photoresist 1502 present in at least a portion of the region corresponding to the IO IL device 1402C.

Figure 16A:
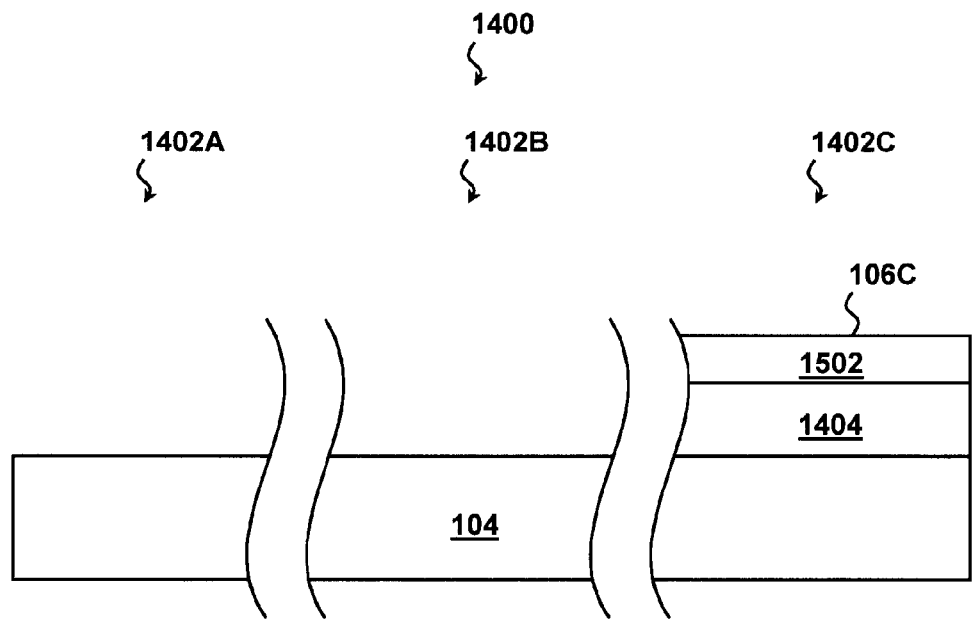
Figure 16B:
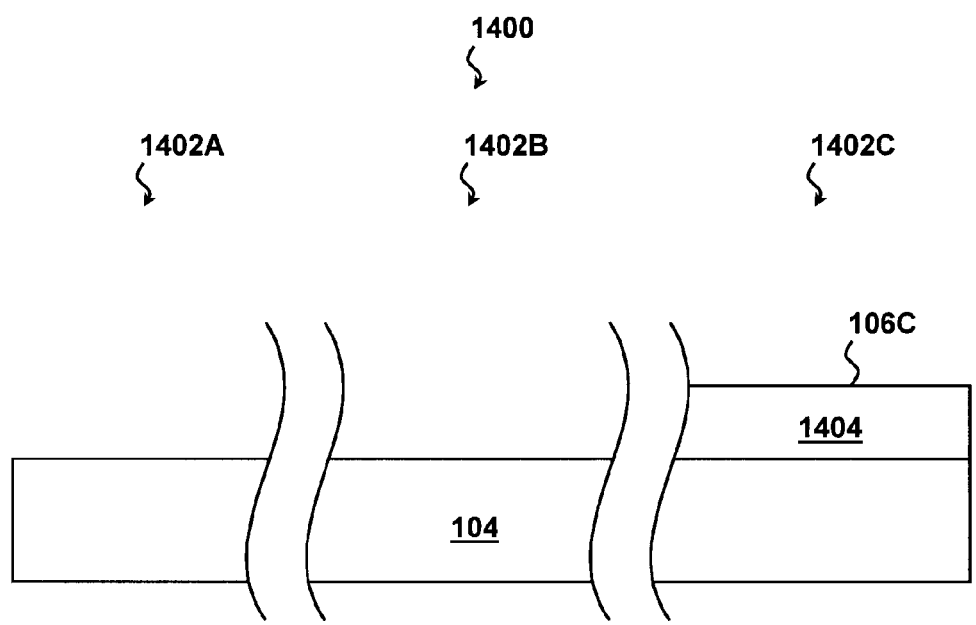

Referring to FIG. 16A and block 1308, the first interfacial layer 1404 is patterned. In some embodiments, the area of the first interfacial layer 1404 unprotected by the first photoresist layer 1502 is patterned by etching. In the illustrated embodiment, patterning removes the first interfacial layer 1404 from at least a portion of the region corresponding to the thin IL device 1402A and at least a portion of the region corresponding to the thick IL device 1402B, but leaves the first interfacial layer 1404 present in at least a portion of the region corresponding to the IO IL device 1402C. The patterning of the first interfacial layer 1404 further defines a gate structure 106C within the region corresponding to the IO IL device 1402C. Patterning may be performed using wet etching, dry etching, reactive ion etching, and/or other suitable etching processes, and in one embodiment, the first interfacial layer 1404 is etched using a dilute HF solution. In alternate embodiments, the first interfacial layer 1404 is patterned using a maskless process such as e-beam or laser etching. Following the patterning of the first interfacial layer 1404, any remaining photoresist 1502 may be stripped from the substrate 104 as illustrated in FIG. 16B.

Figure 17:
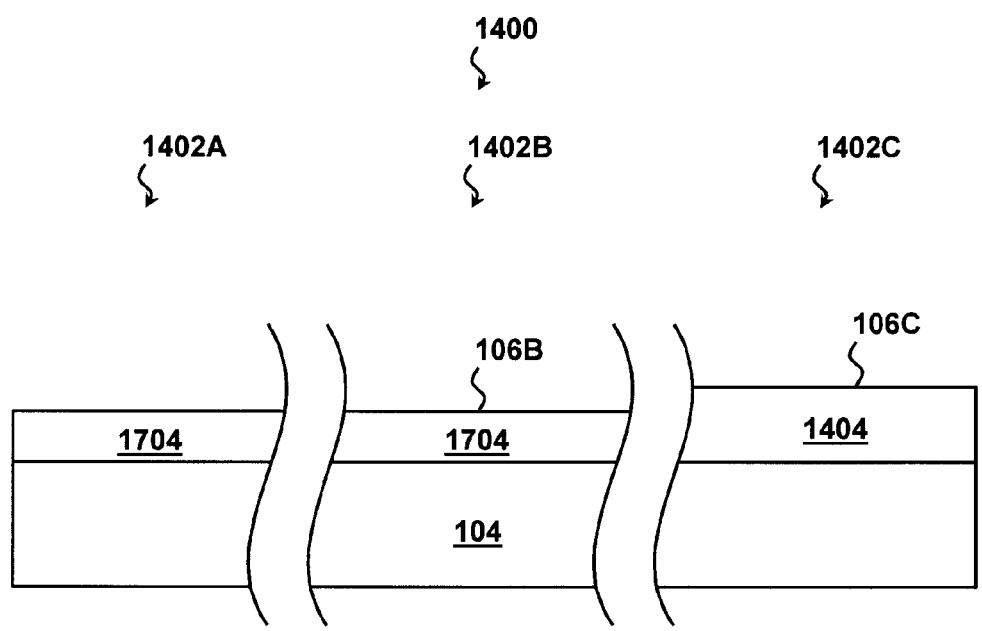

Referring to FIG. 17 and block 1310, a second interfacial layer 1704 is formed on the substrate 104 such that it extends over at least a portion of the region corresponding to the thin IL device 1402A and at least a portion of the region corresponding to the thick IL device 1402B. The first interfacial layer 1404 may prevent the second interfacial layer 1704 from being formed over portions of the region corresponding to device 1402C. For example, the first interfacial layer 1404 may prevent the second interfacial layer 1704 from being formed over the gate structure 106C of device 1402C. The second interfacial layer 1704 may be substantially similar to the interfacial layers 108B and 108C described with respect to FIG. 1. In that regard, the second interfacial layer 1704 may include an interfacial material such as a silicon oxide, silicon nitride, silicon oxynitride, other semiconductor oxides, other suitable interfacial materials, and/or combinations thereof. The second interfacial layer 1704 may be formed to any suitable thickness using any suitable process including thermal growth, atomic layer deposition (ALD), chemical vapor deposition (CVD), high-density plasma CVD (HDP-CVD), physical vapor deposition (PVD), spin-on deposition, and/or other suitable deposition processes.

The second interfacial layer 1704 may be different in composition from the first interfacial layer 1404. In one such embodiment, the second interfacial layer 1704 is formed to a different thickness than the first interfacial layer 1404. In a further such embodiment, the second interfacial layer 1704 is formed to include an interfacial material not included in the first interfacial layer 1404. In yet another such embodiment, the second interfacial layer 1704 is formed to a different thickness than the first interfacial layer 1404 and includes an interfacial material not included in the first interfacial layer 1404. In an embodiment, the second interfacial layer 1704 includes a semiconductor oxynitride and is formed to a thickness of between about 10 Angstroms and about 20 Angstroms.

Figure 18A:
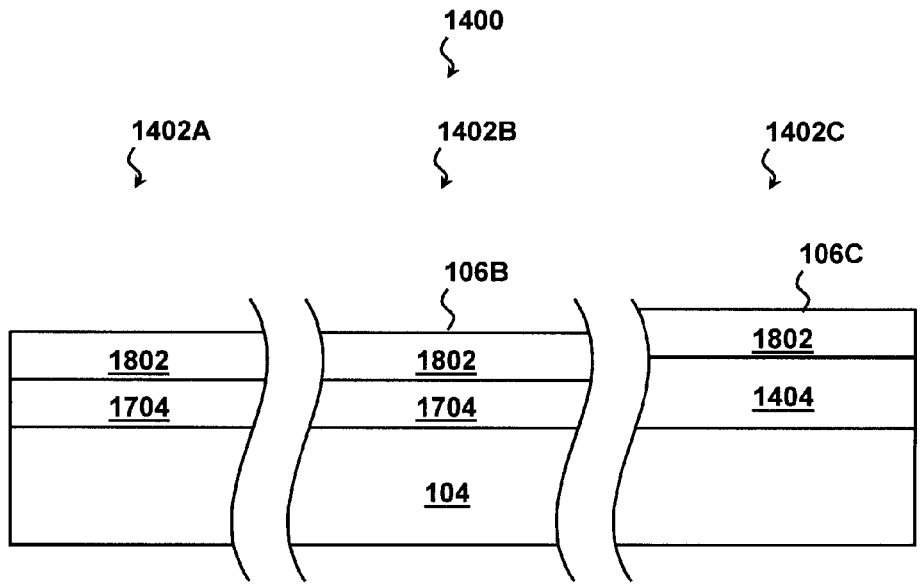
Figure 18B:
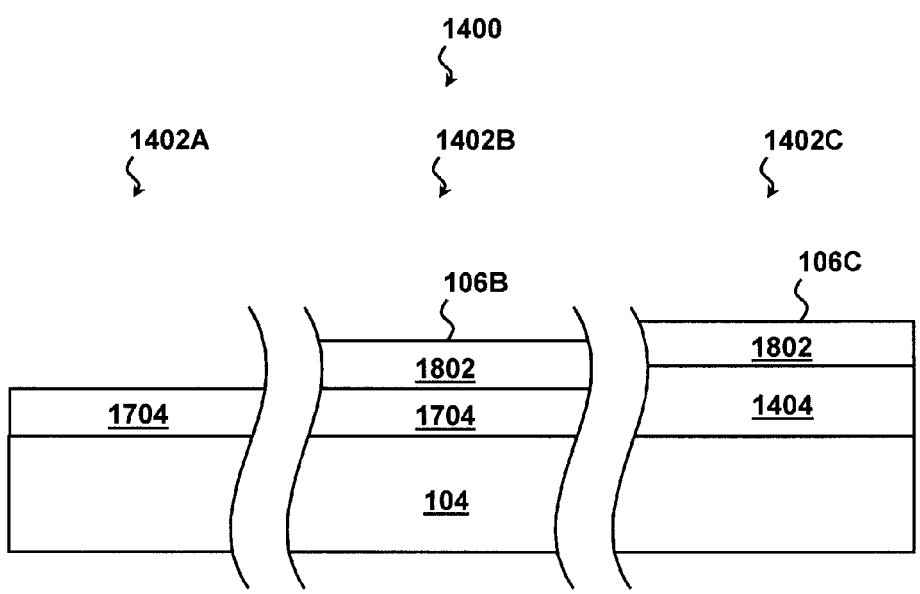

Referring to FIG. 18A and block 1312, a second photoresist layer 1802 may be applied over the substrate 104 and may be used in defining a gate structure of the thick IL device 1402B. The second photoresist 1802 may be exposed in a photolithographic process, baked, and developed to reveal an area to be patterned as illustrated in FIG. 18B. In the illustrated embodiment, the patterning removes the photoresist 1802 from at least a portion of the region corresponding to the thin IL device 1402A, but leaves the photoresist 1802 present in at least a portion of the region corresponding to the thick IL device 1402B and a portion of the region corresponding to the IO IL device 1402C.

Figure 19A:
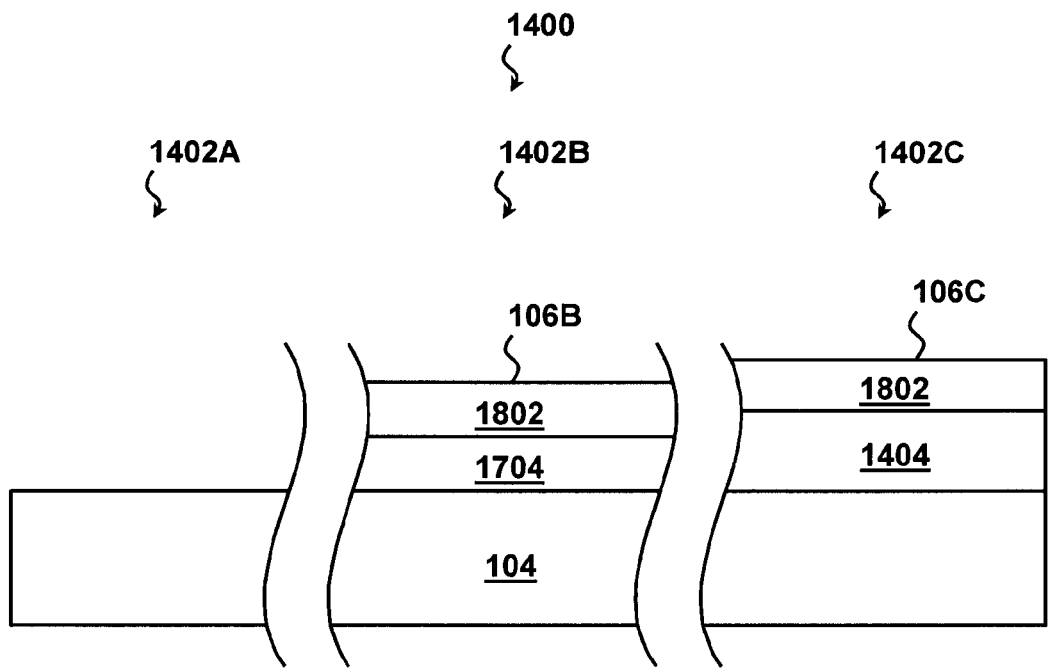
Figure 19B:
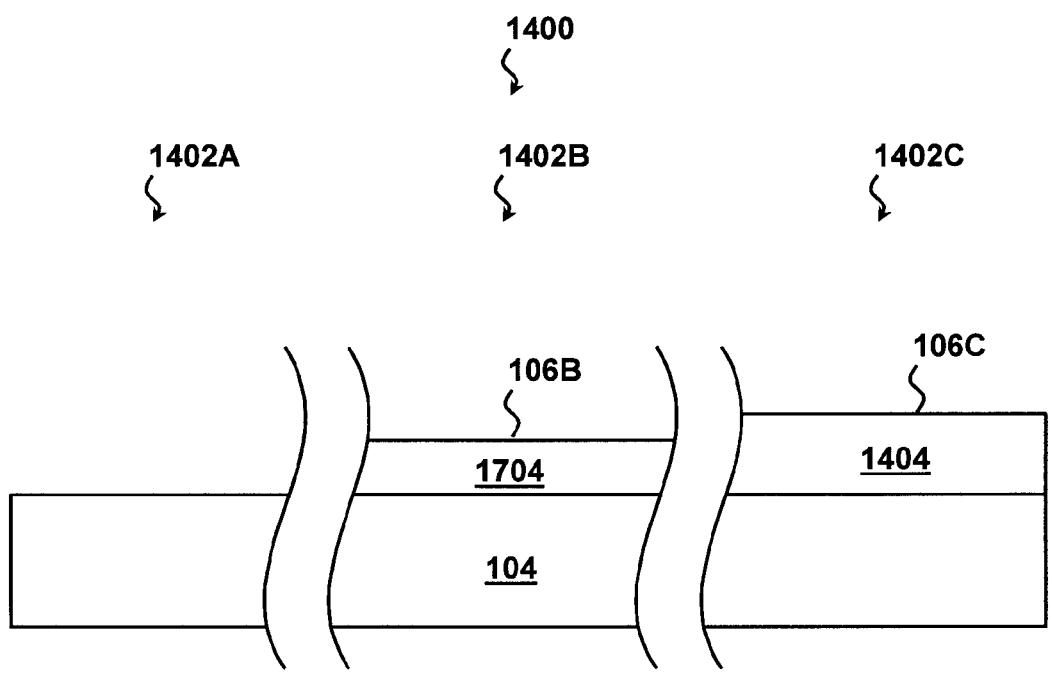

Referring to FIG. 19A and block 1314, the second interfacial layer 1704 is patterned. In some embodiments, the area of the second interfacial layer 1704 unprotected by the second photoresist layer 1802 is patterned by etching. In the illustrated embodiment, patterning removes the second interfacial layer 1704 from at least a portion of the region corresponding to the thin IL device 1402A, but leaves the second interfacial layer 1704 present in at least a portion of the region corresponding to the thick IL device 1402B and a portion of the region corresponding to the IO IL device 1402C. The patterning of the second interfacial layer 1704 also defines a gate structure 106B within the region corresponding to the thick IL device 1402B. Patterning may be performed using wet etching, dry etching, reactive ion etching, and/or other suitable etching processes, and in one embodiment, the second interfacial layer 1704 is etched using a dilute HF solution. In alternate embodiments, the second interfacial layer 1704 is patterned using a maskless process such as e-beam or laser etching. Following the patterning of the second interfacial layer 1704, any remaining photoresist 1802 may be stripped from the substrate 104 as illustrated in FIG. 19B.

Figure 20:
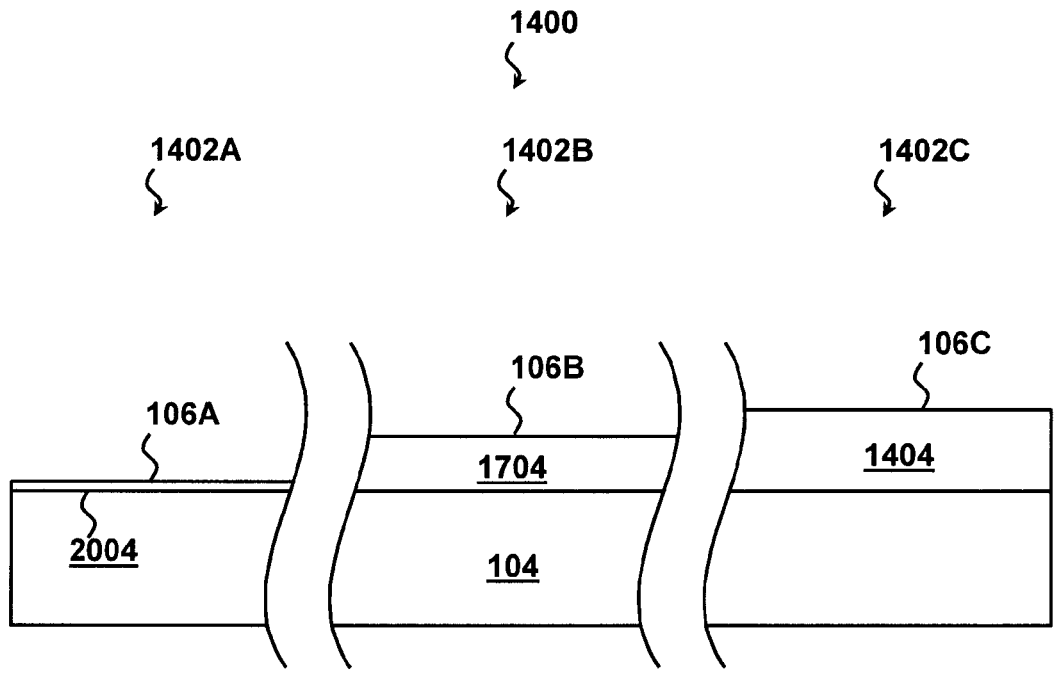

Referring to FIG. 20 and block 1316, a third interfacial layer 2004 is formed on the substrate 104 such that it extends over at least the region corresponding to the thin IL device 1402A. The first interfacial layer 1404 and second interfacial layer 1704 may prevent the third interfacial layer 2004 from being formed over portions of the regions corresponding to devices 1402C and 1402B, respectively. For example, the first interfacial layer 1404 and second interfacial layer 1704 may prevent the third interfacial layer 904 from being formed over the gate structures 106C and 106B of devices 1402C and 1402B, respectively. The third interfacial layer 2004 may be substantially similar to the interfacial layers 108B and 108C described with respect to FIG. 1. In that regard, the third interfacial layer 2004 may include an interfacial material such as a silicon oxide, silicon nitride, silicon oxynitride, other semiconductor oxides, other suitable interfacial materials, and/or combinations thereof. The third interfacial layer 2004 may be formed to any suitable thickness using any suitable process including thermal growth, atomic layer deposition (ALD), chemical vapor deposition (CVD), high-density plasma CVD (HDP-CVD), physical vapor deposition (PVD), spin-on deposition, and/or other suitable deposition processes. The formation of the third interfacial layer 2004 defines a gate structure 106A within the region corresponding to the thin IL device 1402A.

The third interfacial layer 2004 may be different in composition from the first interfacial layer 1404 and second interfacial layer 1704. In one such embodiment, the third interfacial layer 2004 is formed to a different thickness than the first interfacial layer 1404 and second interfacial layer 1704. In a further such embodiment, the third interfacial layer 2004 is formed to include an interfacial material not included in one or more of the first interfacial layer 1404 or the second interfacial layer 1704. In yet another such embodiment, the third interfacial layer 2004 is formed to a different thickness than the first interfacial layer 1404 and second interfacial layer 1704 and includes an interfacial material not included in one or more of the first interfacial layer 1404 or the second interfacial layer 1704. In an embodiment, the third interfacial layer 2004 includes a semiconductor oxynitride and is formed to a thickness of between about 1 Angstroms and about 5 Angstroms less than the thickness of the second interfacial layer 1704. In other words, in the above embodiment, the third interfacial layer 2004 is formed to a thickness of between about 5 Angstroms and 20 Angstroms and less than the thickness of the second interfacial layer 1704. As thinner interfacial layers tend to be more sensitive, and the third interfacial layer 2004 is subject to fewer applications of photoresist and subsequent etchings than the first and second, in some embodiments, the thinnest interfacial layer is selected to be the third interfacial layer 2004.

Figure 21:
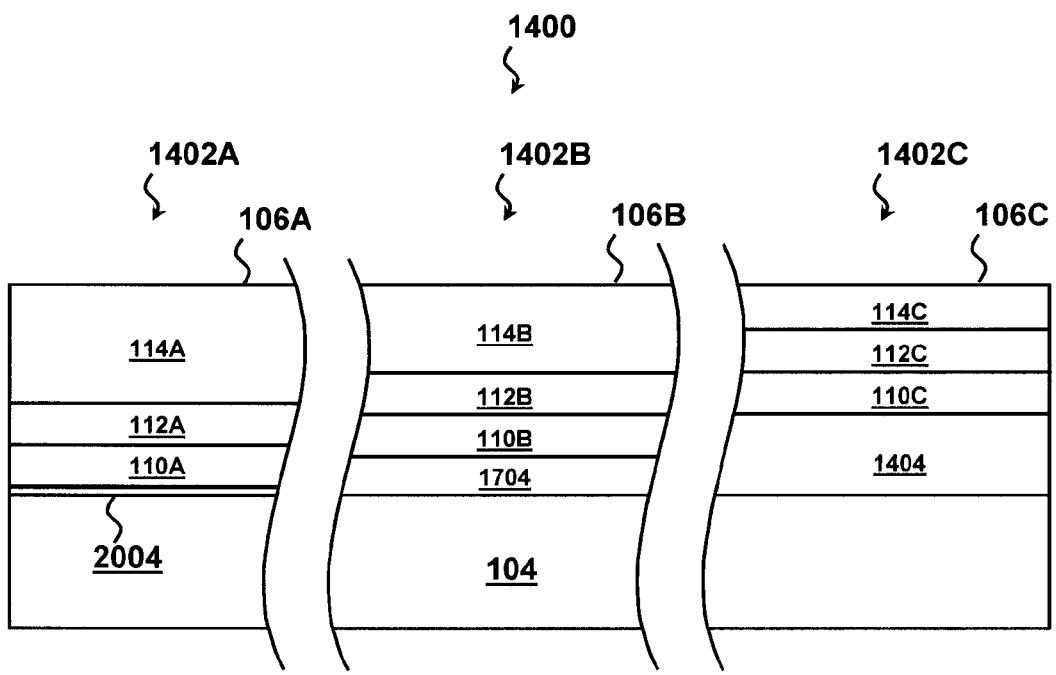
Figure 22:
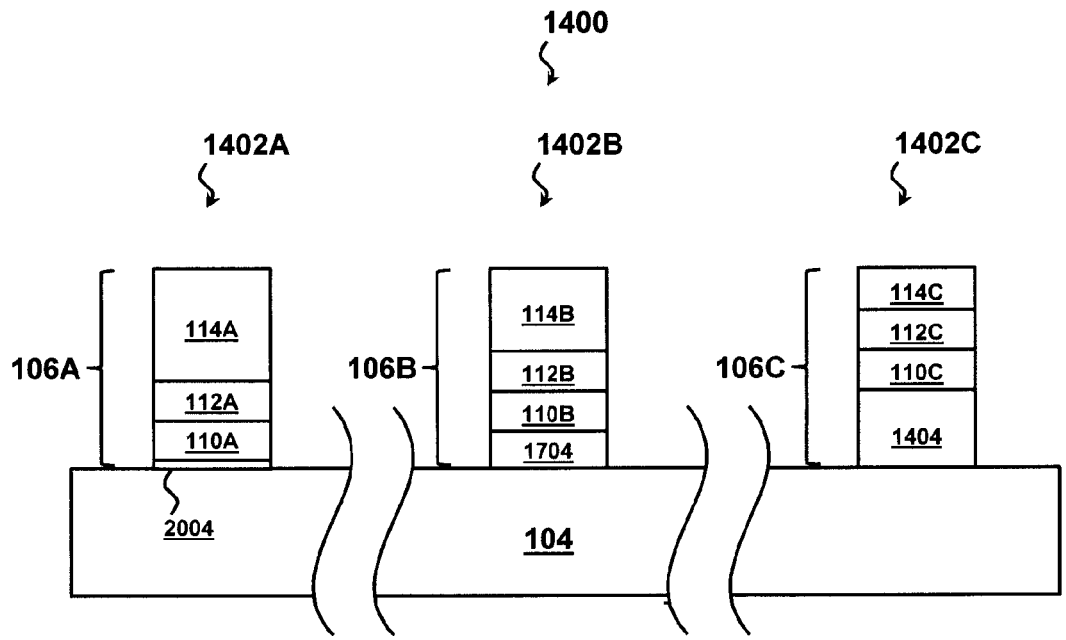
Figure 23:
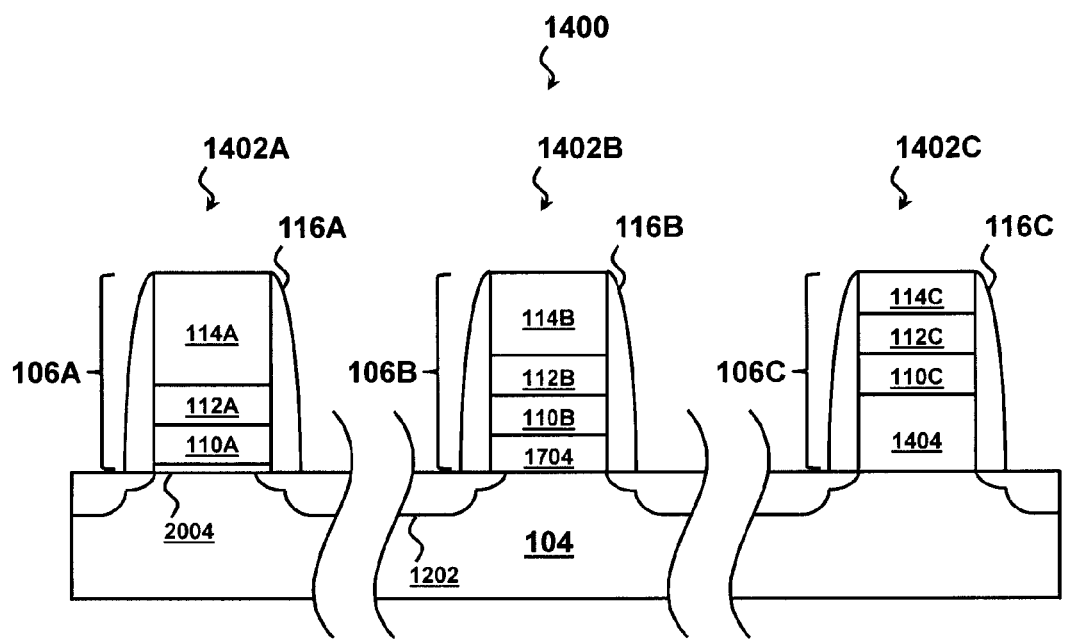

Referring to FIGS. 21-23 and block 1318, subsequent processing steps are performed to finish the fabrication of the first, second, and third devices (e.g., thin IL device 1402A, thick IL device 1402B, and IO IL device 1402C). Referring first to FIG. 21, in some embodiments, a gate dielectric is formed over interfacial layers 2004, 1704, and 1404 of the thin IL device 1402A, thick IL device 1402B, and IO IL device 1402C, respectively, to form dielectric layers 110A, 110B, and 110C, which may be substantially similar to those disclosed with respect to FIG. 1. In some such embodiments, dielectric layers 110A, 110B, and 110C have substantially equal thickness and have substantially the same dielectric composition. In one such embodiment, each of dielectric layers 110A, 110B, and 110C includes the same high-k dielectric formed to a substantially equal thickness between about 10 Angstroms and about 15 Angstroms. These subsequent processes of block 1318 may also include forming one or more capping layers (e.g., capping layers 112A, 112B, and 112C), a gate electrode layer (e.g., gate electrode layers 114A, 114B, and 114C), and/or one or more hard mask layers (not shown), each substantially similar to those disclosed with respect to FIG. 1.

Referring to FIG. 22, the subsequent processing steps of block 1318 may include the shaping of gates 106A, 106B, and 106C using a process including photolithographic patterning and etching. In one embodiment, a layer of photoresist is formed on the regions corresponding to devices 1402A, 1402B, and 1402C by a suitable process, such as spin-on coating. The photoresist is then exposed in a photolithographic process, baked, and developed. The pattern of the photoresist is transferred by a dry etching process to the layers to form gate electrodes and gate dielectric, in a plurality of processing steps and various proper sequences. The photoresist layer may be stripped thereafter.

Referring to FIG. 23, the processing steps of block 1318 may also include forming sidewall spacers 116A, 116B, and 116C on one or more lateral surfaces of the gate structure and/or forming source/drain regions 1202. The source/drain regions 1202 may be doped with p-type dopants (P+), such as boron or $BF_2$, and/or n-type dopants (N+), such as phosphorus or arsenic. In some embodiments, the source/drain regions 1202 are formed by processes including halo implantation, etching, ion-implantation, epitaxy, and/or annealing steps. It is understood that some elements of the devices 1402A, 1402B, and 1402C may be formed by conventional processing, and thus some processes are not described in detail herein.

Thus, the present disclosure provides an integrated circuit incorporating a plurality of device gate configurations and a method for fabricating the circuit. In some embodiments, a method of forming an integrated circuit comprises: receiving a substrate having a first device region, a second device region, and a third device region; forming a first interfacial layer over at least a portion of each of the first device region, the second device region, and the third device region; patterning the first interfacial layer, whereby the patterning of the first interfacial layer defines a gate stack within the third device region; forming a second interfacial layer over at least a portion of the second device region; patterning the second interfacial layer, whereby the patterning of the second interfacial layer defines a gate stack within the second device region; and forming a third interfacial layer over at least a portion of the first device region, whereby the forming of the third interfacial layer defines a gate stack within the first device region.

In some embodiments, a method of forming an integrated circuit, comprises: receiving a substrate, the substrate having a first region, a second region, and a third region defined thereupon; forming a first interfacial layer over the first region, the second region, and the third region; etching the first interfacial layer to remove a portion of the first interfacial layer from the first region and a portion of the first interfacial layer from the second region, wherein the etching of the first interfacial layer defines a gate stack within the third region; forming, after the etching of the first interfacial layer, a second interfacial layer over at least a portion of the second region; etching the second interfacial layer to define a gate stack within the second region; and forming, after the etching of the second interfacial layer, a third interfacial layer on the substrate over at least a portion of the first region to define a gate stack within the first region.

In some embodiments, an integrated circuit comprises: a substrate having a first device region, a second device region, and a third device region; a first device gate disposed over the first device region, the first device gate comprising a first interfacial layer and a first dielectric layer; a second device gate disposed over the second device region, the second device gate comprising a second interfacial layer and a second dielectric layer; and a third device gate disposed over the third device region, the third device gate comprising a third interfacial layer and a third dielectric layer, wherein the first interfacial layer, the second interfacial layer, and the third interfacial layer are different from each other in at least one of a thickness and an interfacial material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
   forming a first interfacial layer over a first region, a second region, and a third region of a substrate;
   patterning the first interfacial layer to remove a portion of the first interfacial layer from the first region, wherein the patterning of the first interfacial layer defines a first gate stack having a first gate stack height within the third region, wherein the first gate stack includes:
      the first interfacial layer having a first thickness,
      a first dielectric layer on the first interfacial layer,
      a first capping layer on the first dielectric layer, and
      a first electrode layer over the first capping layer;
   forming, after the patterning of the first interfacial layer, a second interfacial layer over at least a portion of the second region;
   patterning the second interfacial layer to define a second gate stack within the second region, wherein the second gate stack has the first gate stack height and includes:
      the second interfacial layer of a second thickness,
      a second gate dielectric layer on the second interfacial layer,
      a second capping layer over the second gate dielectric layer, and
      a second electrode layer over the second capping layer; and
   forming, after the patterning of the second interfacial layer, a third interfacial layer on the substrate over at least a portion of the first region to define a third gate stack within the first region the third gate stack within the first region has the first gate stack height, and wherein the third gate stack includes:
      the third interfacial layer of a third thickness,
      a third gate dielectric on the third interfacial layer,
      a third capping layer over the third gate dielectric, and
      a third electrode layer over the third capping layer,
   wherein the first thickness is greater than the second thickness and the second thickness is greater than the third thickness.

2. The method of claim 1, wherein the patterning of the first interfacial layer completely removes the first interfacial layer from the first region.

3. The method of claim 1, wherein the first interfacial layer, the second interfacial layer, and the third interfacial layer are different from each other in interfacial material.

4. The method of claim 1, wherein the forming of the first interfacial layer produces the first interfacial layer including a silicon oxide.

5. The method of claim 1, wherein the first, second and third dielectric layers have substantially equal thicknesses and substantially equal compositions of dielectric material.

6. The method of claim 1, wherein at least one of the first, second and third dielectric layers includes a high-k dielectric material.

7. The method of claim 1, wherein the third interfacial layer has a different composition than each of the first interfacial layer and the second interfacial layer.

8. A method of forming an integrated circuit, the method comprising:
   receiving a substrate having a first device region, a second device region, and a third device region;
   forming a first interfacial layer over at least a portion of each of the first device region, the second device region, and the third device region;
   etching the first interfacial layer, whereby the etching of the first interfacial layer defines a portion of a third gate stack within the third device region and removes the first interfacial layer from the second region;
   forming a second interfacial layer over at least a portion of the second device region, wherein the second interfacial layer devices a portion of a second gate stack within the second device region;
   after removing the first interfacial layer from the first device region, forming a third interfacial layer over at least a portion of the first device region, whereby the forming of the third interfacial layer defines a portion of a first gate stack within the first device region, and wherein each of the first, second and third gate stacks have a first height.

9. The method of claim 8, wherein the removing the first interfacial layer from the first device region is performed during the etching the first interfacial layer.

10. The method of claim 8, wherein the third interfacial layer is thinner than the first and second interfacial layers.

11. The method of claim 10, wherein the first interfacial layer is thicker than the second interfacial layer.

12. The method of claim 8, wherein after the etching the first interfacial layer, the first interfacial layer remains on the first device region.

13. The method of claim 12, wherein the removing the first interfacial layer from the first device region is performed after forming the second interfacial layer.

14. A method of forming an integrated circuit, the method comprising:
   forming a first interfacial layer having a first thickness over at least a portion of each of a first device region, a second device region, and a third device region;
   patterning the first interfacial layer, whereby the patterning of the first interfacial layer maintains the first interfacial layer in the first device region and the third device region and removes the interfacial layer from the second device region;

forming a second interfacial layer having a second thickness over at least a portion of the second device region;

after forming the second interfacial layer, removing the first interfacial layer from the first device region;

forming a third interfacial layer having a third thickness over at least a portion of the first device region; and defining a first gate stack, a second gate stack and a third gate stack, wherein the defining includes forming the first gate stack that includes:
- the first interfacial layer having the first thickness,
- a first dielectric layer on the first interfacial layer, and
- a first electrode layer over the first dielectric layer;

forming the second gate stack that includes:
- the second interfacial layer having the second thickness,
- a second gate dielectric layer on the second interfacial layer, and
- a second electrode layer over the second gate dielectric layer; and forming the third gate stack that includes:
- the third interfacial layer having the third thickness,
- a third gate dielectric on the third interfacial layer, and
- a third electrode layer over the third interfacial layer;

wherein the first thickness is greater than the second thickness, and the second thickness is greater than the third thickness.

15. The method of claim 14, wherein the first gate stack further includes a first capping layer interposing the first gate dielectric layer and the first electrode layer.

16. The method of claim 14, wherein the forming the first interfacial layer includes forming a silicon oxide.

17. The method of claim 14, wherein each of the first, second and third gate stacks have a substantially equal gate height.

18. The method of claim 17, wherein the forming the defining the first, second and third gate stacks includes forming first, second and third dielectric layers having substantially equal thickness.

19. The method of claim 18, wherein the second gate stack further includes a second capping layer interposing the second gate dielectric layer and the second electrode layer.

20. The method of claim 19, wherein the third gate stack further includes a third capping layer interposing the third gate dielectric layer and the third electrode layer.

* * * * *